US012402320B2

(12) United States Patent
Lin et al.

(10) Patent No.: US 12,402,320 B2
(45) Date of Patent: Aug. 26, 2025

(54) THREE-DIMENSIONAL FERROELECTRIC MEMORY DEVICE WITH WIDTH-DIFFERENTIATED CHANNEL AND FERROELECTRIC SEGMENTS

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 110 days.

(21) Appl. No.: 18/361,548

(22) Filed: Jul. 28, 2023

(65) Prior Publication Data
US 2023/0389325 A1 Nov. 30, 2023

Related U.S. Application Data

(63) Continuation of application No. 17/241,751, filed on Apr. 27, 2021, now Pat. No. 11,765,906.

(51) Int. Cl.
*H10B 51/20* (2023.01)
*H10B 51/30* (2023.01)
*H10D 64/23* (2025.01)

(52) U.S. Cl.
CPC .............. *H10B 51/20* (2023.02); *H10B 51/30* (2023.02); *H10D 64/252* (2025.01); *H10D 64/258* (2025.01)

(58) Field of Classification Search
CPC ........ H10B 51/10; H10B 51/20; H10B 51/30; H10D 64/252; H10D 64/2523; H10D 64/2527; H10D 64/258
See application file for complete search history.

(56) References Cited

U.S. PATENT DOCUMENTS

2021/0399016 A1   12/2021  Jiang et al.
2021/0408044 A1*  12/2021  Chiang ................. H10B 51/10
2022/0037362 A1*  2/2022   Lin ........................ H10B 51/20
2022/0173251 A1   6/2022   Samachisa et al.
(Continued)

FOREIGN PATENT DOCUMENTS

DE    10 2021 101 243 A1    12/2021

*Primary Examiner* — Matthew E Warren
(74) *Attorney, Agent, or Firm* — FOLEY & LARDNER LLP

(57) ABSTRACT

A memory device includes a plurality of first memory cells disposed along a vertical direction. Each of the plurality of first memory cells includes a portion of a first channel segment that extends along the vertical direction and has a first sidewall and a second sidewall. The first and second sidewalls of the first channel segment facing toward and away from a first lateral direction, respectively. Each of the plurality of first memory cells includes a portion of a first ferroelectric segment that also extends along the vertical direction and is in contact with the first sidewall of the first channel segment. A width of the first ferroelectric segment along a second lateral direction is different from a width of the first channel segment along the second lateral direction. The second lateral direction is perpendicular to the first lateral direction.

20 Claims, 20 Drawing Sheets

(56) References Cited

U.S. PATENT DOCUMENTS

| | | | |
|---|---|---|---|
| 2022/0231049 A1* | 7/2022 | Lin | H10B 51/20 |
| 2022/0285384 A1* | 9/2022 | Yang | H10B 43/20 |
| 2022/0285395 A1* | 9/2022 | Yang | H01L 29/78391 |
| 2022/0384487 A1 | 12/2022 | Sun et al. | |

* cited by examiner

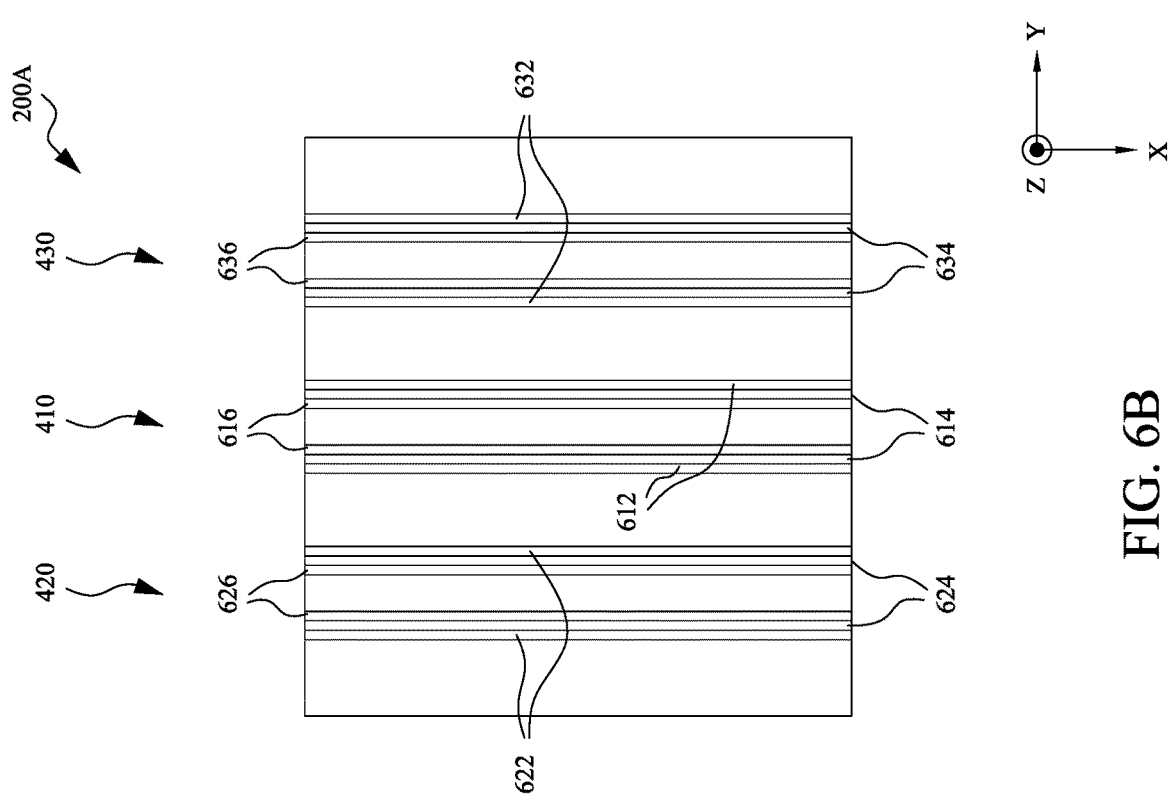
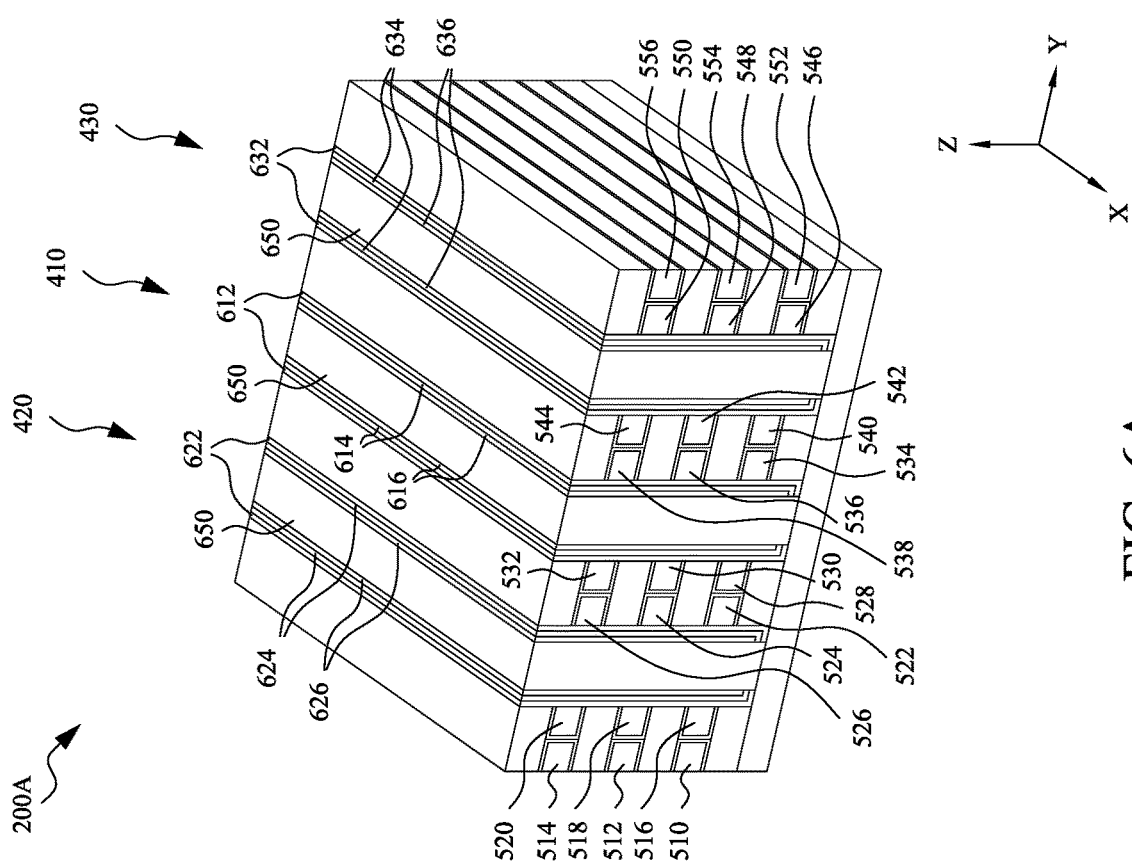
FIG. 6B
FIG. 6A

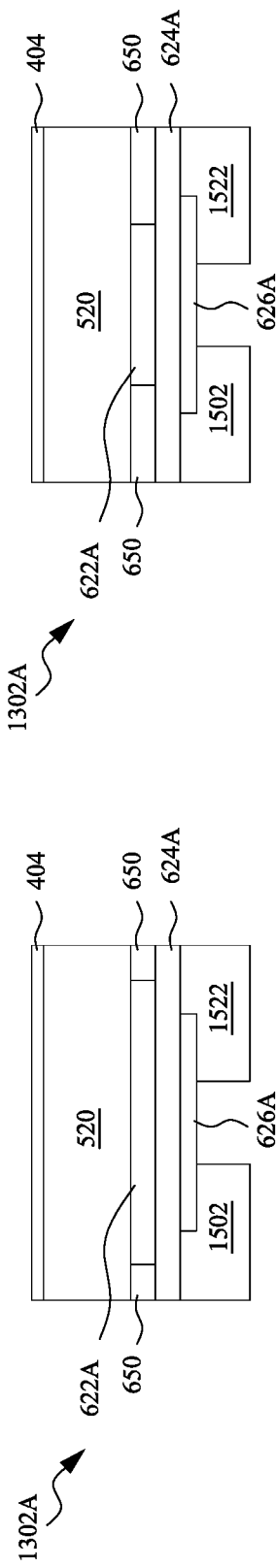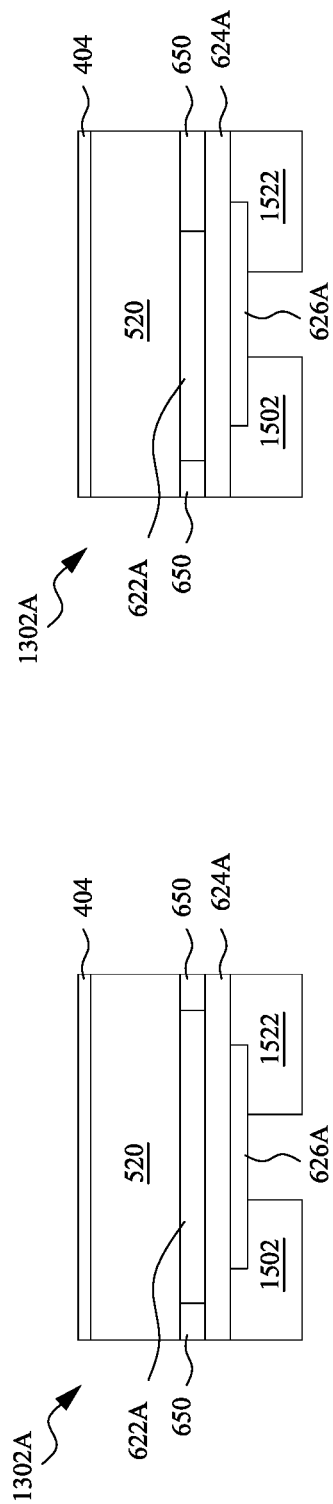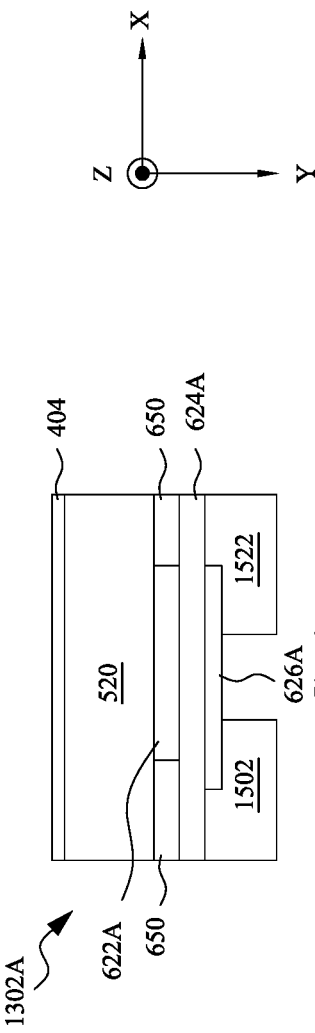

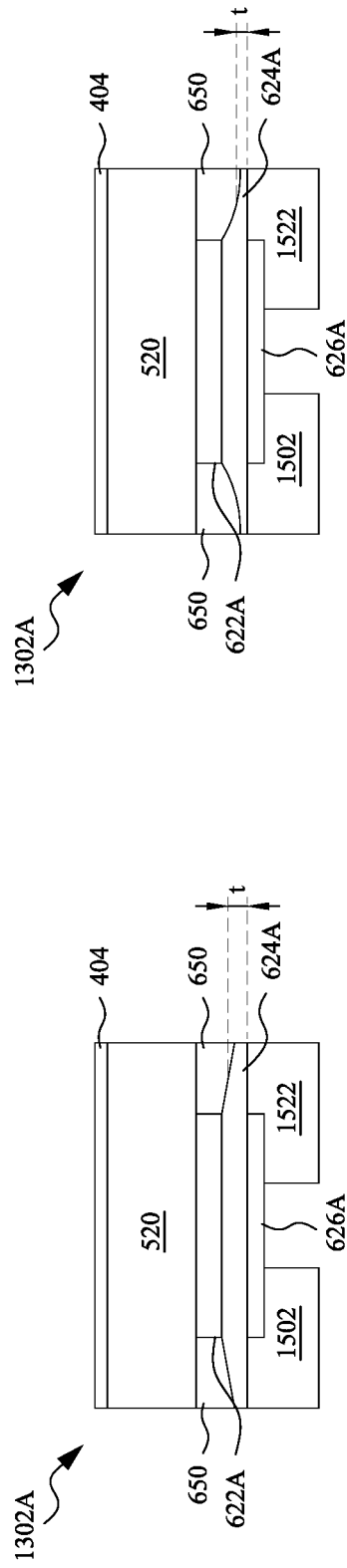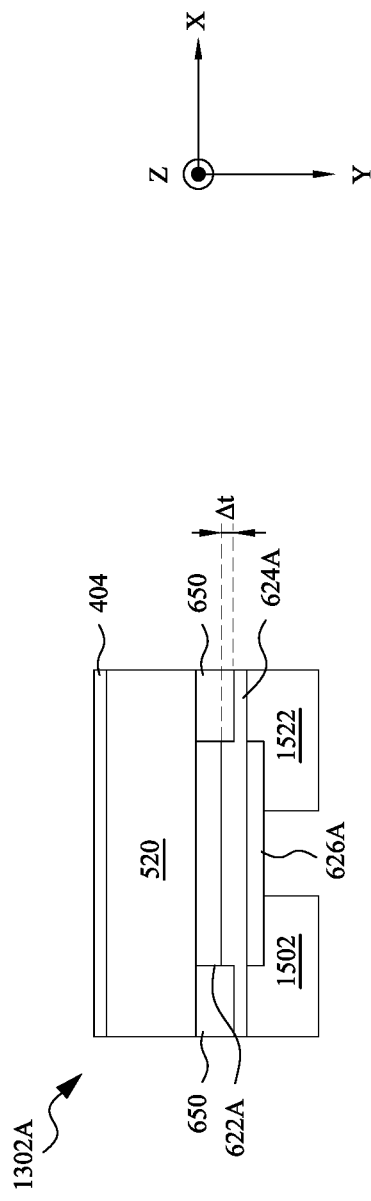

THREE-DIMENSIONAL FERROELECTRIC MEMORY DEVICE WITH WIDTH-DIFFERENTIATED CHANNEL AND FERROELECTRIC SEGMENTS

CROSS-REFERENCE TO RELATED APPLICATION

This application is a continuation application of U.S. patent application Ser. No. 17/241,751, filed on Apr. 27, 2021, which is incorporated herein by reference in its entirety for all purposes.

BACKGROUND

The present disclosure generally relates to a semiconductor device and a method of manufacturing the same and, more particularly, to a semiconductor device including a stacked body and a method of manufacturing the same.

A non-volatile memory device retains data stored therein even when not powered. Two-dimensional memory devices in which memory cells are fabricated in a single layer over a substrate have reached physical limits in terms of increasing their degree of integration. Accordingly, three-dimensional (3D) non-volatile memory devices in which memory cells are stacked in a vertical direction over a substrate have been proposed. In general, a 3D non-volatile memory device includes a number of memory cells stacked on top of one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 12A, 12B, 13A, 13B, 14A, 14B, 15A, and 15B each illustrate a perspective or top view of an example three-dimensional memory device during various fabrication stages, made by the method of FIG. 1, in accordance with some embodiments.

FIGS. 17A, 17B, 17C, 17D, 17E, 17F, 17G, 17H, and 17I each illustrate a cross-sectional view of an example memory cell, made by the method of FIG. 1, in accordance with some embodiments.

DETAILED DESCRIPTION

Figure 1:
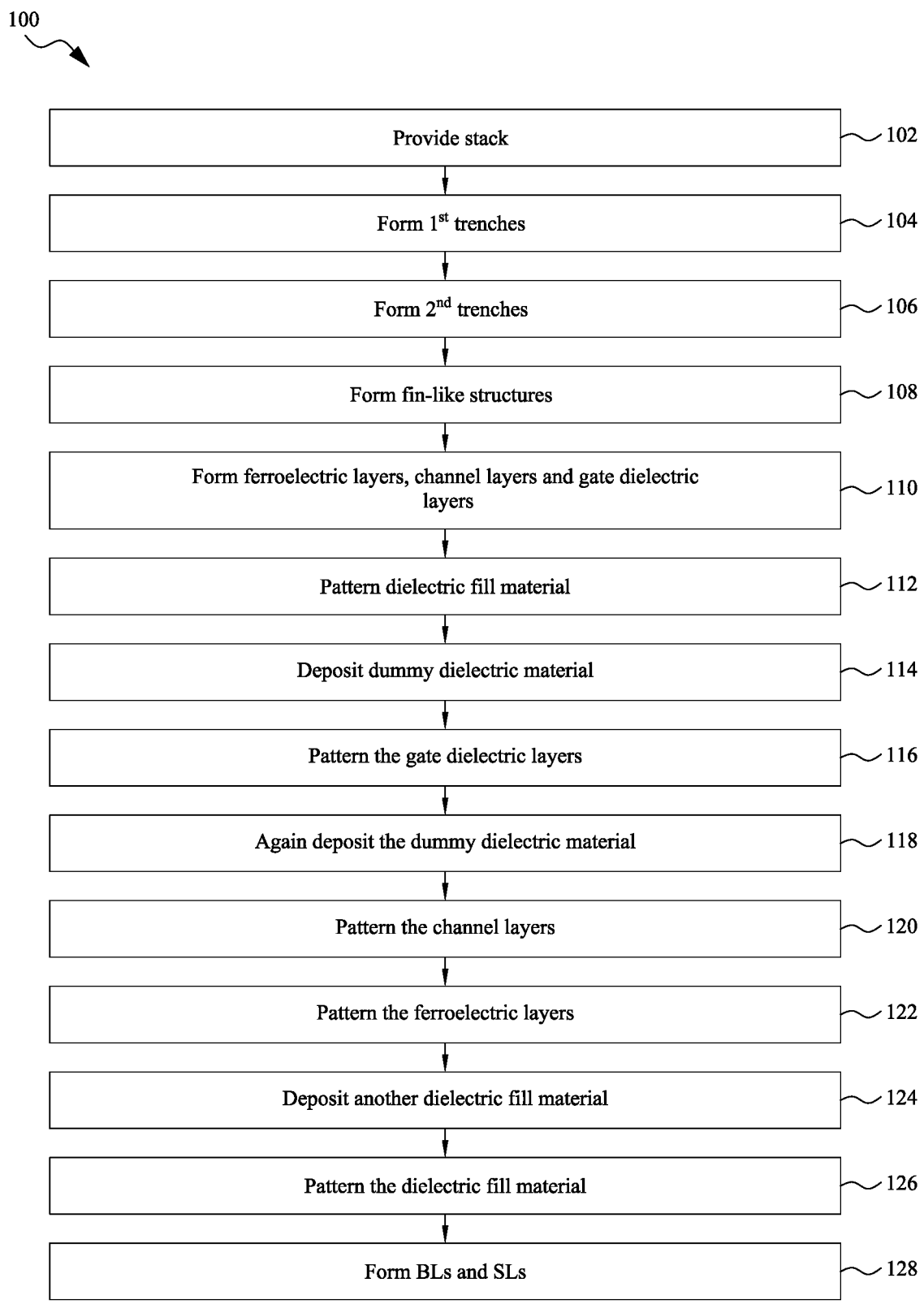
FIG. 1 illustrates a flow chart of an example method for making a three-dimensional memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a three-dimensional (3D) memory device, and methods of forming the same. The 3D memory device, as disclosed herein, includes a number of memory cells formed as a memory array. The memory cells are formed across multiple memory levels (or tiers) over a substrate. Each of the memory cells is implemented as a ferroelectric memory cell. For example, each ferroelectric memory cell can be constituted by at least one of: a portion of a semiconductor channel layer that continuously extends along a vertical direction of the array, a portion of a ferroelectric layer that also continuously extends along the vertical direction of the array, one of a number of first conductive structures (functioning as its gate electrode) that continuously extends along a lateral direction of the array, a second conductive structure (functioning as its source electrode) that continuously extends along the vertical lateral direction of the array, and a third conductive structure (functioning as its drain electrode) that continuously extends along the vertical lateral direction of the array. The gate electrodes, drain electrodes, and source electrodes may sometimes be referred to as "word line (WL)," "bit line (BL)," and "source/select line (SL)," respectively.

In various embodiments, the semiconductor layer is in contact with the ferroelectric layer, in which the semiconductor channel layer may be formed to have a width (along the lateral direction) that is greater than a width of the ferroelectric layer (along the lateral direction). Further, a gap between such "extensions" of the channel layer and the ferroelectric layer may be replaced with a dielectric layer having a low dielectric constant (typically referred to as a "low-k dielectric material"). In this way, a capacitance induced between the WL and either of the SL or BL can be greatly reduced. By reducing the capacitance(s), performance and design of the memory cells (and the memory array as a whole) can be significantly improved. For example, operation speed of the memory array can be increased, while not sacrificing the size and scalability of the memory array.

In general, a ferroelectric memory device (sometimes referred to as a "ferroelectric random access memory (Fe-RAM)" device) contains a ferroelectric material to store information. The ferroelectric material acts as the memory material of the memory device. The dipole moment of the ferroelectric material is programmed in two different orientations (e.g., "up" or "down" polarization positions based on oxygen atom position in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material. Although the following discussed embodiments of the disclosed 3D memory device are directed to a ferroelectric memory device, it should be appreciated that some of the embodiments may be used in any of various other types of 3D non-volatile memory devices (e.g., magnetoresistive random access memory (MRAM) devices, phase-change random access memory (PCRAM) devices, etc.), while remaining within the scope of the present disclosure.

FIG. 1 illustrates a flowchart of a method 100 to form a 3D memory device, according to one or more embodiments of the present disclosure. For example, at least some of the operations (or steps) of the method 100 can be used to form a 3D ferroelectric memory device. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 200 may be associated with perspective and/or top views of an example 3D memory device at various fabrication stages as shown in FIGS. 2, 3, 4, 5, 6A, 6B, 7A, 7B, 8A, 8B, 9A, 9B, 10A, 10B, 11A, 11B, 12A, 12B, 13A, 13B, 14A, 14B, and 15B, respectively, which will be discussed in further detail below.

In brief overview, the method 100 starts with operation 102 of providing a stack of insulating layers and sacrificial layers over a substrate. The method 100 continues to operation 104 of forming a number of first trenches. Each of the first trenches is partially filled by a metallic fill material. The method 100 continues to operation 106 of forming a number of second trenches. Each of the second trenches is partially filled by a metallic fill material. The method 100 continues to operation 108 of forming a number of fin-like structures (exposing the first and second trenches again). A number of word lines (WLs) may thus be formed. The method 100 continues to operation 110 of forming a number of ferroelectric layers, a number of channel layers, and a number of gate dielectric layers. The method 100 continues to operation 112 of patterning a dielectric fill material. The method 100 continues to operation 114 of depositing a dummy dielectric material. The method 100 continues to operation 116 of patterning the gate dielectric layers. The method 100 continues to operation 118 of again depositing the dummy dielectric material. The method 100 continues to operation 120 of patterning the channel layers. The method 100 continues to operation 122 of patterning the ferroelectric layers. The method 100 continues to operation 124 of depositing another dielectric fill material. The method 100 continues to operation 126 of patterning the dielectric fill material. The method 100 continues to operation 128 of forming a number of bit lines and a number of source/select lines.

In various embodiments, the 3D memory device 200 may be formed during a back-end-of-line (BEOL) process. For example, the 3D memory device 200 may be formed across multiple metallization layers that are formed above a number of transistors over a substrate (which are typically referred to as a front-end-of-line (FEOL) process). Thus, it should be understood the 3D memory device 200, as hereinafter illustrated, is simplified and thus, may include a number of various other devices (not shown in the following figures) such as peripheral transistors, staircase WLs, etc., while remaining within the scope of the present disclosure.

Figure 2:
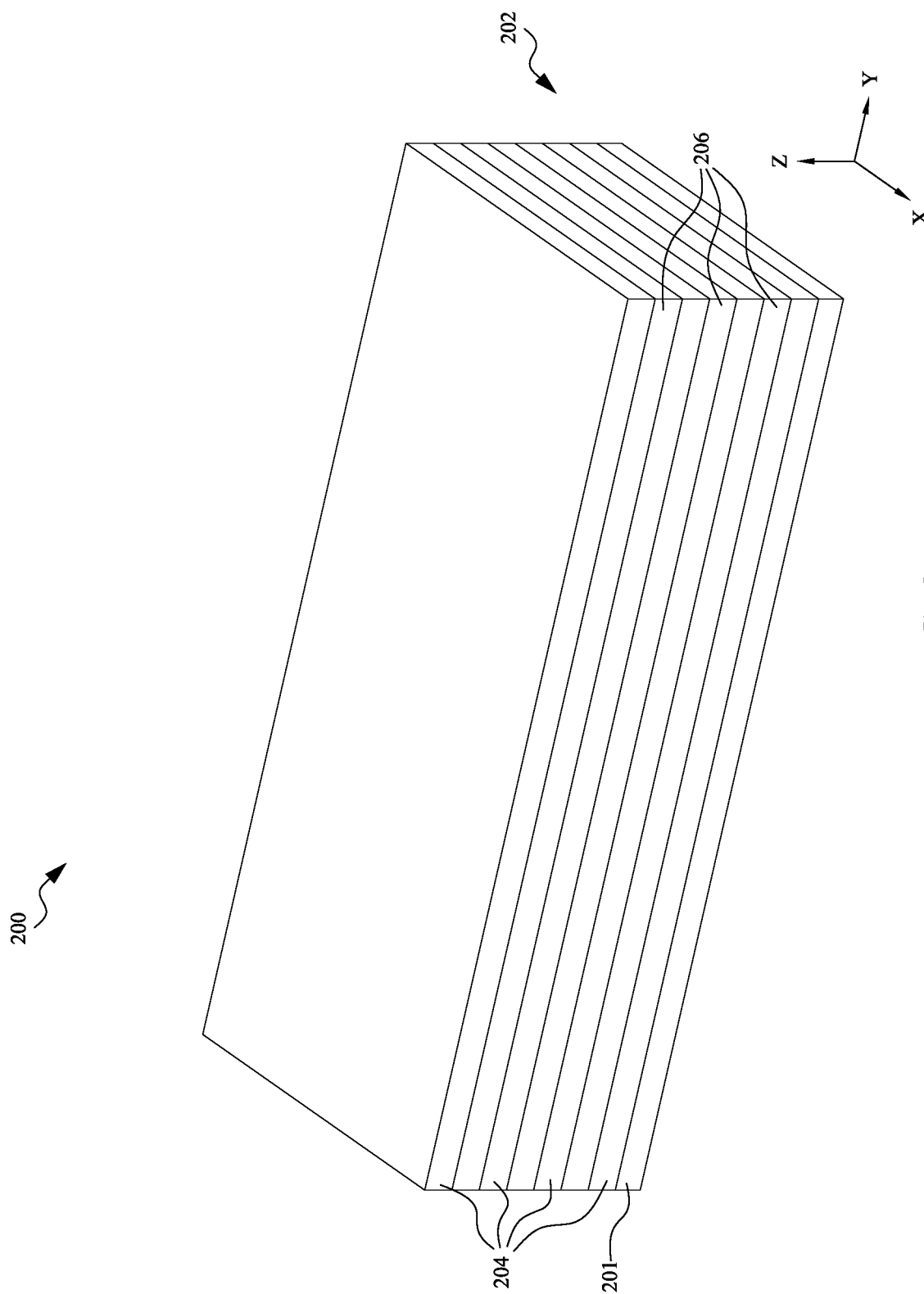

Corresponding to operation 102 of FIG. 1, FIG. 2 is a perspective view of the 3D memory device 200 including a stack 202 formed over a semiconductor substrate 201 at one of the various stages of fabrication, in accordance with various embodiments.

The substrate 201 may be a semiconductor substrate, such as a bulk semiconductor, a semiconductor-on-insulator (SOI) substrate, or the like, which may be doped (e.g., with a p-type or an n-type dopant) or undoped. The substrate 201 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 201 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. It should be understood that the substrate 201 can include any of various other suitable materials while remaining within the scope of the present disclosure.

The stack 202 includes a number of insulating layers 204 and a number of sacrificial layers 206 alternately stacked on top of one another over the substrate 201 along a vertical direction (e.g., the Z direction). Although four insulating layers 204 and three sacrificial layers 206 are shown in the illustrated embodiment of FIG. 2, it should be understood that the stack 202 can include any number of insulating layers and any number of sacrificial layers alternately disposed on top of one another, while remaining within the scope of the present disclosure. Further, although the stack 202 directly contacts the substrate 202 in the illustrated embodiment of FIG. 2, it should be understood that the stack 202 is separated from the substrate 201 (as mentioned above). For example, a number of (planar and/or non-planar) transistors may be formed over the substrate 201, and a number of metallization layers, each of which includes a number of contacts electrically connecting to those transistors, may be formed between the substrate 201 and the stack 202. As used herein, the alternately stacked insulating layers 204 and sacrificial layers 206 refer to each of the sacrificial layers 206 being adjoined by two adjacent insulating layers 204. The insulating layers 204 may have the same thickness thereamongst, or may have different thicknesses. The sacrificial layers 206 may have the same thickness thereamongst, or may have different thicknesses. In some embodiments, the stack 202 may begin with the insulating layer 204 (as shown in FIG. 2) or the sacrificial layer 206.

The insulating layers 204 can include at least one insulating material. The insulating materials that can be employed for the insulating layer 204 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 204 can be silicon oxide.

The sacrificial layers 206 may include an insulating material, a semiconductor material, or a conductive material. The material of the sacrificial layers 206 is a sacrificial material that can be subsequently removed selective to the material of the insulating layers 204. Non-limiting examples of the sacrificial layers 206 include silicon nitride, an amorphous semiconductor material (such as amorphous silicon), and a polycrystalline semiconductor material (such as polysilicon). In one embodiment, the sacrificial layers 206 can be spacer material layers that include silicon nitride or a semiconductor material including at least one of silicon or germanium.

The stack 202 can be formed by alternately depositing the respective materials of the insulating layers 204 and sacrificial layers 206 over the substrate 201. In some embodiments, one of the insulating layers 204 can be deposited, for example, by chemical vapor deposition (CVD), followed by depositing, for example, using CVD or atomic layer deposition (ALD), one of the sacrificial layers 206.

Figure 3:
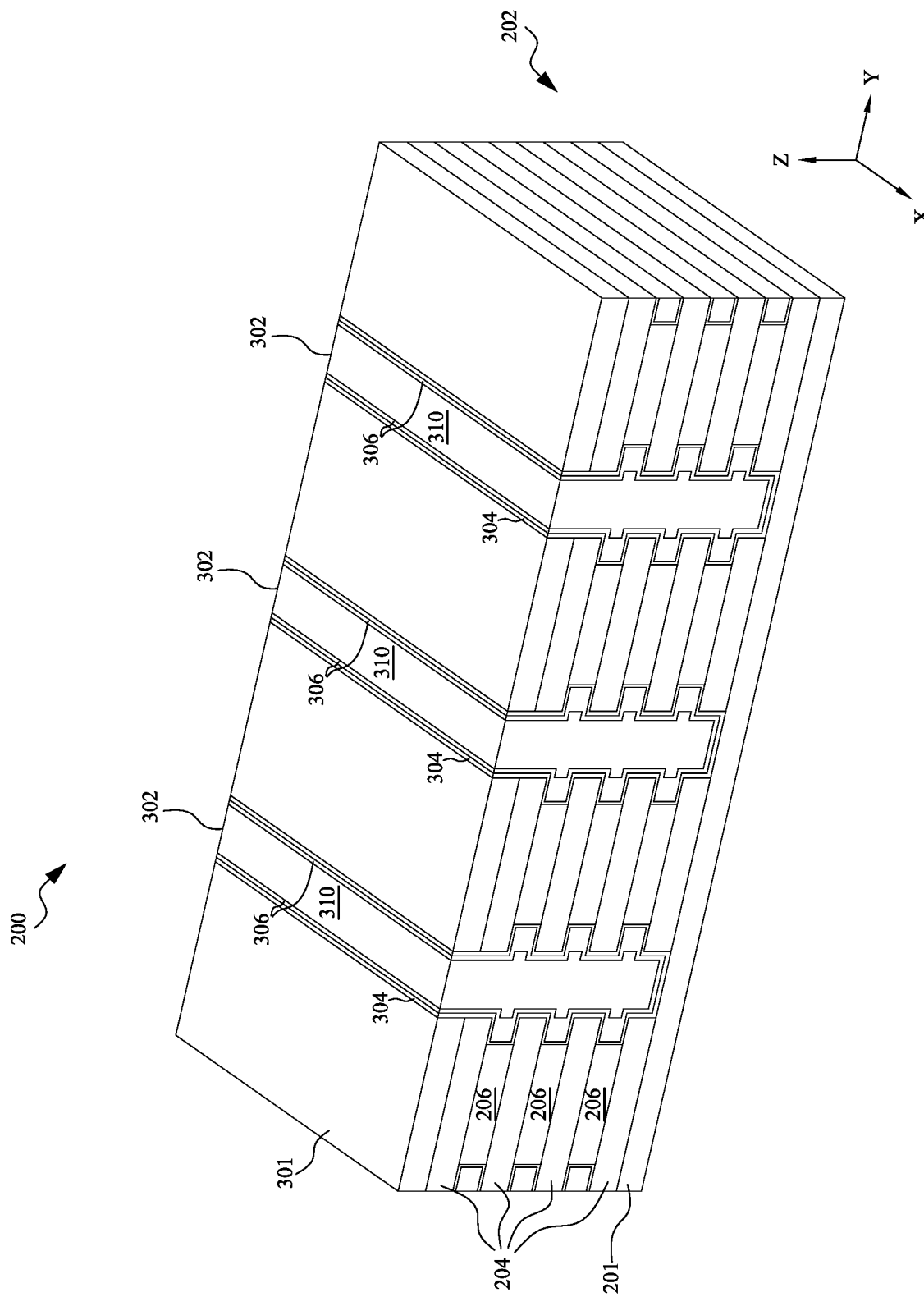

Corresponding to operation 104 of FIG. 1, FIG. 3 is a perspective view of the 3D memory device 200 in which the stack 202 is patterned to form a number of first trenches 302 at one of the various stages of fabrication, in accordance with various embodiments. Although three first trenches 302 are shown in the illustrated embodiment of FIG. 3, it should be understood that the 3D memory device 200 can include any number of first trenches 302, while remaining within the scope of the present disclosure.

The first trenches 302 all extend along a lateral direction (e.g., the X direction). The first trenches 302 can be formed by performing at least some of the following processes: forming a blanket mask layer 301 over the stack 202; patterning the blanket mask layer 301 to form a number of openings (or windows); and, with the patterned mask layer 301 covering a number of portions of the stack 202, etching the stack 202 using a first etching process.

The first etching process may include, for example, a reactive ion etch (ME) process, a neutral beam etch (NBE) process, the like, or combinations thereof. The first etching process may be anisotropic. As such, the first trenches 302, vertically extending through the stack 202, can be formed, which are each indicated as dotted lines in FIG. 3. For example, the first trenches 302 (after the first etching process) may have nearly vertical sidewalls, each of which is collectively constituted by respective etched sidewalls of the insulating layers 204 and sacrificial layers 206. In some embodiments, the first trenches 302 may be strips (when viewed from the top) parallel to each other, and closely spaced with respect to each other (by the remaining portions of the stack 202).

Next, respective end portions of each of the sacrificial layers 206 may be recessed to laterally (e.g., along the Y direction) extend the first trenches 302. The sacrificial layers 206 can be recessed by performing a second etching process that etches the sacrificial layers 206 selective to the insulating layers 204 through the first trenches 302. Alternatively stated, the insulating layers 204 may remain substantially intact throughout the second etching process. As such, the first trenches 302 (after the second etching process) can each include its inner sidewalls present in a step-like profile.

The second etching process can include a wet etching process employing a wet etch solution, or can be a gas phase (dry) etching process in which the etchant is introduced in a vapor phase into the first trenches (dotted lines). In the example where the sacrificial layers 206 include silicon nitride and the insulating layers 204 include silicon oxide, the second etching process can include a wet etching process in which the workpiece is immersed within a wet etch tank that includes phosphoric acid, which etches silicon nitride of the sacrificial layer 206 selective to silicon oxide, silicon, and various other materials of the insulating layers 204.

Next, a glue layer 304 can be (e.g., conformally) formed over the step-like first trenches 302. Such a glue layer 304 may be formed with a relatively thin thickness (e.g., less than 10 nanometers), which allows the glue layer 304 to follow the step-like profile of the first trenches. In some embodiments, the glue layer 304 may include an oxygen-containing dielectric layer. The oxygen-containing dielectric layer may include silicon oxycarbide (SiCO), tetraethyl orthosilicate (TEOS), silicon oxide ($SiO_2$), or the like, which may be deposited by using e.g., chemical vapor deposition (CVD), plasma enhanced CVD (PECVD), low pressure CVD (LPCVD), or other deposition techniques.

Next, a metallic fill layer 306 can be (e.g., conformally) formed over the step-like first trenches 302, with the glue layer 304 disposed therebetween. In some embodiments, the metallic fill layer 306 can fill the "recesses" inwardly extending toward the sacrificial layers 206 with respect to the insulating layers 204, as shown in FIG. 3. The metallic fill layer 306 includes at least one metal material selected from tungsten, copper, cobalt, ruthenium, titanium, tantalum, or combinations thereof. It should be understood that the metallic fill layer 306 can include any of various other suitable materials while remaining within the scope of the present disclosure. The metallic fill layer 306 can be deposited by a conformal deposition method, which can be, for example, chemical vapor deposition (CVD), atomic layer deposition (ALD), electroless plating, electroplating, or a combination thereof. In some embodiments, upon forming the metallic fill layer 306, the first trenches 302 may not be fully filled out. As such, an insulating fill layer 310 may be deposited, for example, by CVD to fill out the first trenches 302. The insulating fill layer 310 may include an insulating material similar as the insulating layers 204.

Figure 4:
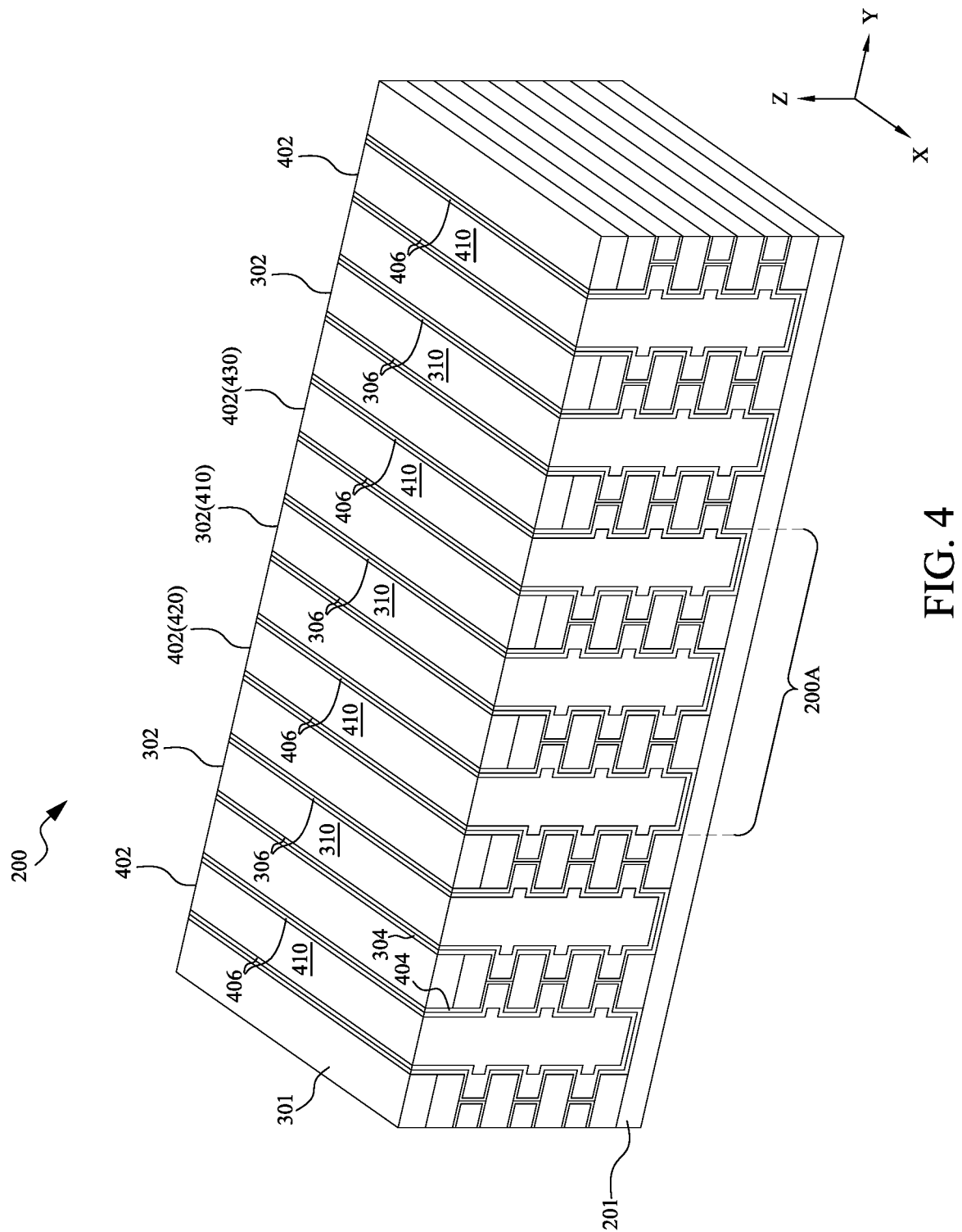

Corresponding to operation 106 of FIG. 1, FIG. 4 is a perspective view of the 3D memory device 200 in which the stack 202 is further patterned to form a number of second trenches 402 at one of the various stages of fabrication, in accordance with various embodiments. Although four second trenches 402 are shown in the illustrated embodiment of FIG. 4, it should be understood that the 3D memory device 200 can include any number of second trenches 402, while remaining within the scope of the present disclosure.

The second trenches 402, substantially similar as the first trenches 302, are formed between adjacent ones of the first trenches 302, as shown in FIG. 4. In some embodiments, the number of first trenches 302 may correspond to the number of second trenches 402. For example, when the number of first trenches 302 is "N," the number of second trenches 402 is "N+1." As shown, the second trenches 402 may be strips (when viewed from the top) parallel to each other and to the first trenches 302, and closely spaced with respect to each other (by the remaining portions of the stack 202). Similarly, upon forming the second trenches 402 present in a step-like profile (e.g., through the above-described first and second etching processes), a glue layer 404, a metallic fill layer 406, and an insulating fill layer 410 are sequentially formed over the second trenches 402. The glue layer 404, metallic fill layer 406, and the insulating fill layer 410 are substantially similar to the glue layer 304, metallic fill layer 306, and the insulating fill layer 310 (described with respect to FIG. 3), respectively, and thus, the discussions are not repeated. In some embodiments, the glue layer 304 (formed over the first trenches 302) and the glue layer 404 (formed over the second trenches 402) may contact with each other, as shown in FIG. 4. In some other embodiments, the glue layers 304 and 404 may be optional. As such, the respective portions of the metallic fill layers 306 and 406 that inwardly extend into the recesses may be separated by an insulating material. The insulating material (e.g., silicon oxide) may be a material that replaces a remaining portion of the sacrificial layer 206 between the portions of the metallic fill layers 306 and 406 that inwardly extend into the recesses. In some other embodiments, the glue layer 304 and glue layer 404 may separate from each other with an insulating material (e.g., silicon oxide).

In each of the following discussions of the remaining operations of FIG. 1, a portion of the 3D memory device 200, e.g., 200A indicated in FIG. 4, is used as an illustrative example. Such a portion of the 3D memory device 200 (hereinafter "3D memory device 200A") includes the middle first trench 302 (hereinafter "middle trench 410") and the two second trenches 402 next to the middle trench 410 (hereinafter "left trench 420" and "right trench 430," respectively).

Figure 5:
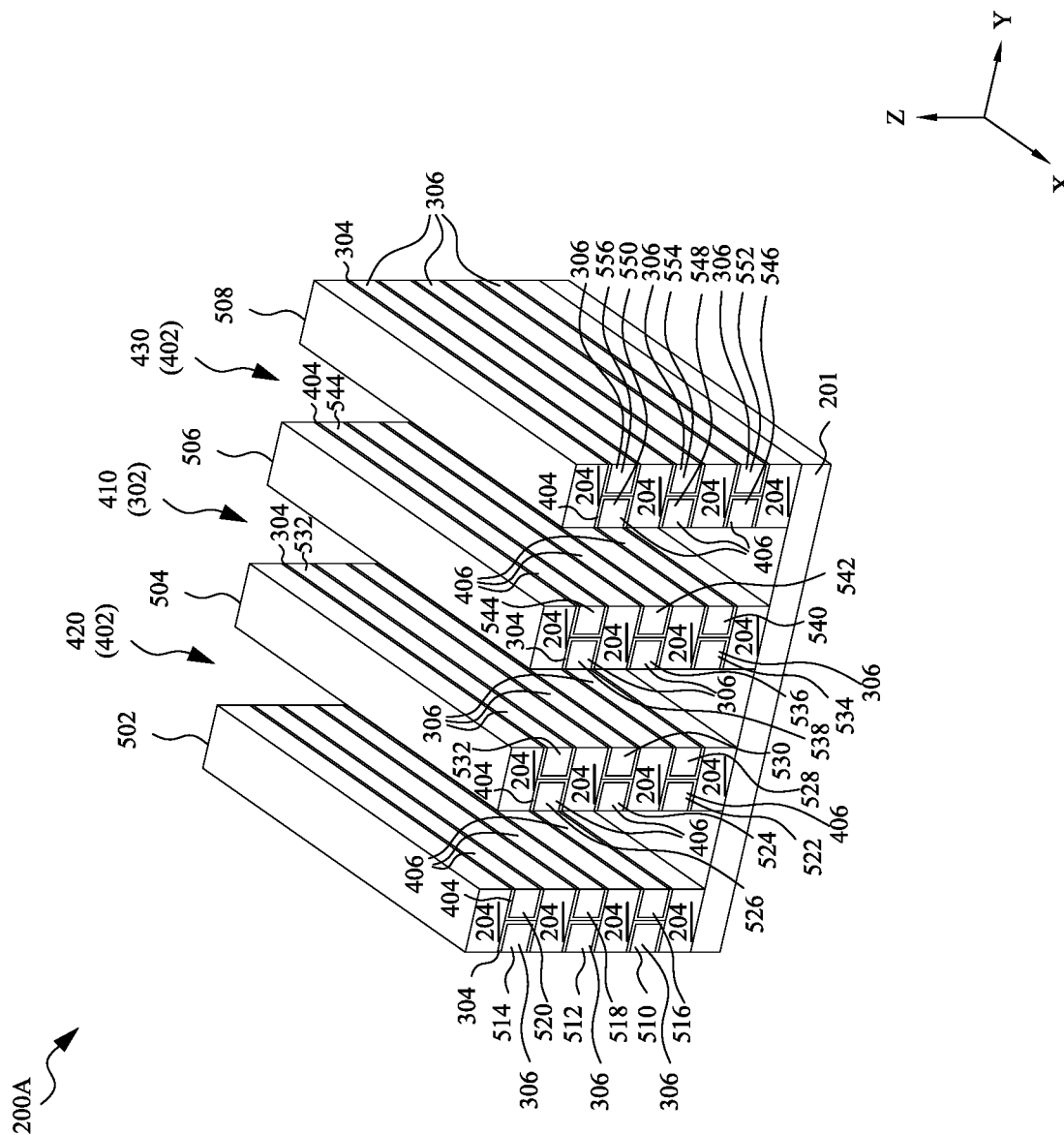

Corresponding to operation 108 of FIG. 1, FIG. 5 is a perspective view of the 3D memory device 200A in which a number of fin-like structures 502, 504, 506, and 508 are formed at one of the various stages of fabrication, in accordance with various embodiments.

As shown, the fin-like structures 502 to 508 (sometimes referred to as stripe structures) all extend along a lateral direction (e.g., the X direction), and are in parallel with one another. Each of the fin-like structures 502 to 508 includes a number of layers (or tiers) alternately stacked on top of one another. In particular, each fin-like structure includes an alternate stack of a number of (remaining portions of) the insulating layers 204 and a number of pairs of conductive structures. Such a pair of conductive structures (in each tier) include the portion of the metallic fill layer 306 (that fills the recess through the first trench 302) and the portion of the metallic fill layer 406 (that fills the recess through the second trench 402). The conductive structures of each pair may be electrically isolated from each other with a pair of the glue layers 304 and 404.

INN In various embodiments, the portion of the metallic fill layer 306 or 406 in each tier extends along a lateral direction (e.g., the X direction), and may function as a word line (WL). Each WL is coupled to a number of memory cells disposed along a certain trench in each tier, which will be discussed in further detail below. Hereinafter, such conductive structures may sometimes be referred to as WLs 510, 512, 514, 516, 518, 520, 522, 524, 526, 528, 530, 532, 534, 536, 538, 540, 542, 544, 546, 548, 550, 552, 554, and 556, respectively. As shown, the pair of WLs 510 and 516, the pair of WLs 522 and 528, the pair of WLs 534 and 540, and the pair of WLs 546 and 552 may be formed in the first tiers of the fin-like structures 502 to 508, respectively; the pair of WLs 512 and 518, the pair of WLs 524 and 530, the pair of WLs 536 and 542, and the pair of WLs 548 and 554 may be formed in the second tiers of the fin-like structures 502 to 508, respectively; and the pair of WLs 514 and 520, the pair of WLs 526 and 532, the pair of WLs 538 and 544, and the pair of WLs 550 and 556 may be formed in the third tiers of the fin-like structures 502 to 508, respectively.

Upon forming the fin-like structures 502 to 508, the left, middle, and right trenches 410-430 may again be exposed, which can expose respective sidewalls of the WLs 510 to 556. As some representative examples, the pair of WLs 522 and 528, back-to-back coupled to each other, have their sidewalls exposed in the trenches 420 and 410, respectively; the pair of WLs 534 and 540, back-to-back coupled to each other, have their sidewalls exposed in the trenches 410 and 430, respectively; and the pair of WLs 538 and 544, back-to-back coupled to each other, have their sidewalls exposed in the trenches 410 and 430, respectively.

To form the fin-like structures 502 to 508, the insulating fill layers 310 and 410 (FIG. 4) may be first removed, for example, by a wet etching process (or an otherwise isotropic etching process). Next, with the patterned mask layer 301 serving as a mask, an dry etch process (or an otherwise anisotropic etching process) may be performed to remove portions of the metallic fill layers 306 and 406 that laterally protrude from the respective sidewalls of different portions of the patterned mask layer 301 along the Y direction, thereby forming the nearly vertical sidewalls of the fin-like structures 502 to 508. Next, the patterned mask layer 301 may be removed by a chemical-mechanical polishing (CMP) process to expose respective top surfaces of the topmost insulating layers 204 of the fin-like structures 502 to 508, as shown in FIG. 5.

Corresponding to operation 110 of FIG. 1, FIG. 6A is a perspective view of the 3D memory device 200A including a ferroelectric layer, a channel layer, and a gate dielectric layer in each of the trenches 410 to 430 at one of the various stages of fabrication, in accordance with various embodiments. Further, FIG. 6B is a top view of the 3D memory device 200A, corresponding to FIG. 6A.

In various embodiments, each of the ferroelectric layers includes two portions, each of which is formed to extend along one of the sidewalls of a corresponding trench. As such, each portion of the ferroelectric layer is in contact with a corresponding number of WLs (through their respective exposed sidewalls). Over each ferroelectric layer, a channel layer also includes two portions that are in contact with the two portion of that ferroelectric layer, respectively. Over each channel layer, a gate dielectric layer also includes two portions that are in contact with the two portion of that channel layer, respectively. As shown in the illustrated example of FIGS. 6A-B, a ferroelectric layer 622, a channel layer 624, and a gate dielectric layer 626 are formed in the left trench 420; a ferroelectric layer 612, a channel layer 614, and a gate dielectric layer 616 are formed in the middle trench 410; and a ferroelectric layer 632, a channel layer 634, and a gate dielectric layer 636 are formed in the right trench 430. Taking the ferroelectric layer 622, channel layer 624, and gate dielectric layer 626 in the left trench 420 as a representative example, the ferroelectric layer 622 that extends along the X direction has two portions, one of which is in contact with the WLs 516 to 520, and the other of which is in contact with the WLs 522 to 526.

Further, as each of the ferroelectric layers, channel layers, and gate dielectric layers may be conformally formed over the trench as a liner layer (which will be discussed below), at least the ferroelectric layers and channel layers may each present an L-shaped profile, as shown in FIG. 6A. Alternatively stated, in addition to the (vertical) portions that contact the respective WLs, each ferroelectric layer can have (lateral) leg portions. In particular, each ferroelectric layer has two leg portions (extending along the Y direction) pointing to each other. Similarly, in addition to the (vertical) portions that contact the respective ferroelectric layer, each channel layer can have (lateral) leg portions. Each channel layer has two leg portions (extending along the Y direction) pointing to each other.

The ferroelectric layers 612, 622, and 632 each include a ferroelectric material. As used herein, a "ferroelectric material" refers to a material that displays a spontaneous electric polarization even when there is no applied electric field and that has the polarization that can be reversed by the application of an external electric field.

In one embodiment, the ferroelectric material includes an orthorhombic metal oxide of which a unit cell has a non-zero permanent electric dipole moment. In one embodiment, the orthorhombic metal oxide includes an orthorhombic hafnium doped zirconium oxide or an orthorhombic hafnium oxide doped with a dopant having an atomic radius that is between 40% smaller than to 15% larger than the atomic radium of hafnium. However, it should be understood that the atomic radius of the dopant can be in any suitable range, while remaining within the scope of the present disclosure. For example, the orthorhombic metal oxide can include an orthorhombic phase hafnium oxide doped with at least one of silicon, aluminum, yttrium, gadolinium and zirconium. The atomic concentration of the dopant atoms (e.g., aluminum atoms) can be in a range from 0.5% to 16.6%. In one embodiment, the atomic concentration of the dopant atoms can be greater than 1.0%, 2.0%, 3.0%, 5.0%, 7.5%, and/or 10%. Alternatively or additionally, the atomic concentration of the dopant atoms can be less than 15%, 12.5%, 10%, 7.5%, 5.0%, 3.0%, and/or 2.0%. However, it should be understood that the atomic concentration can be in any suitable range, while remaining within the scope of the present disclosure.

The orthorhombic phase of the orthorhombic metal oxide can be a doping-induced non-centrosymmetric crystalline phase that generates a remanent dipole moment upon application and removal of an external electric field. Specifically, polarization of the oxygen atoms with respect to the metal atoms in the orthorhombic metal oxide can induce non-centrosymmetric charge distribution due to the positions (e.g., up or down positions) of the oxygen atoms in the orthorhombic lattice.

The ferroelectric material (of the ferroelectric layers 612, 622, and 632) can be deposited over the workpiece as a continuous liner structure, for example, by a conformal deposition method such as atomic layer deposition (ALD) or chemical vapor deposition (CVD). For example, a metal-organic precursor gas and oxygen gas can be alternately or simultaneously flowed into a processing chamber to deposit the ferroelectric material. The deposited material of the ferroelectric material can be annealed at an elevated temperature that induces formation of the orthorhombic phase in the ferroelectric material. As a non-limiting example, temperature for formation of the orthorhombic metal oxide material in the ferroelectric material can be in a range from 450 degrees Celsius to 850 degrees Celsius, and typically has a window of about 200 degrees Celsius that depends on the composition of the metal oxide. After deposition, the ferroelectric material can be annealed at a temperature of 500 to 850 degrees Celsius, such as 500 to 700, such as 550 to 600 degrees Celsius to increase the amount of the orthorhombic phase in the ferroelectric material. However, it should be understood that the ferroelectric material can formed be in any suitable deposition condition, while remaining within the scope of the present disclosure.

The average thickness of the ferroelectric material can be in a range from 5 nm to 30 nm, such as from 6 nm to 12 nm, although lesser and greater average thicknesses can also be employed. As used herein, a "thickness" refers to the average thickness unless indicated otherwise. The ferroelectric material can have a thickness variation that is less than 30% from an average thickness. In one embodiment, the thickness variation of the ferroelectric material can be less than 20%, less than 10%, and/or less than 5% of the average thickness of the ferroelectric material.

The channel layers 614, 624, and 634 each include a semiconductor material such as at least one elemental semiconductor material, at least one III-V compound semiconductor material, at least one II-VI compound semiconductor material, at least one organic semiconductor material, or other semiconductor materials. In one embodiment, the semiconductor material includes amorphous silicon or polysilicon. In one embodiment, the semiconductor material can have a doping of the first conductivity type.

The semiconductor material (of the channel layers 614, 624, and 634) can be formed over the workpiece as a continuous liner structure, for example, by a conformal deposition method such as low pressure chemical vapor deposition (LPCVD). The thickness of the semiconductor material can be in a range from 3 nm to 30 nm, although lesser and greater thicknesses can also be employed. In one embodiment, the semiconductor material can have a doping of the first conductivity type.

The gate dielectric layers 616, 626, and 636 can include a high-k dielectric material. Example high-k dielectric materials include a metal oxide or a silicate of Hf, Al, Zr, La, Mg, Ba, Ti, Pb, and combinations thereof. The high-k dielectric material (of the gate dielectric layers 616, 626, and 636) can be deposited over the workpiece as a liner structure using any suitable method, including, for example, molecular beam deposition (MBD), atomic layer deposition (ALD), plasma enhanced chemical vapor deposition (PECVD), and the like. The thickness of the high-k dielectric material can be in a range from 3 nm to 30 nm, although lesser and greater thicknesses can also be employed.

To form the ferroelectric layers 612, 622, and 632, the channel layers 614, 624, and 634, and the gate dielectric layers 616, 626, and 636 (as shown in FIGS. 6A-B), the above-mentioned ferroelectric material, semiconductor material, and high-k dielectric material may be sequentially formed over the workpiece. Each of the ferroelectric material, semiconductor material, and high-k dielectric material may be formed as a continuous liner structure over the workpiece. In various embodiments, the trenches 410-430 cannot be completely filled by the ferroelectric material, semiconductor material, and high-k dielectric material. Next, an anisotropic etching process may be performed to cut or otherwise separate the continuous ferroelectric material, semiconductor material, and high-k dielectric material. As such, the ferroelectric material, semiconductor material, and high-k dielectric material are each cut into two portions in each of the trenches 410 through 430. Further, a dielectric fill material 650 can be deposited over the workpiece to fill any unfilled volume within the trenches 410 through 430. The dielectric fill material 650 includes a dielectric material such as, for example, silicon oxide, organosilicate glass, an otherwise low-k dielectric material, or combinations thereof. The dielectric fill material 650 can be deposited by a conformal deposition method such as low pressure chemical vapor deposition (LPCVD), or by a self-planarizing deposition process such as spin coating. Following the deposition of the dielectric fill material 650, a CMP process may be performed to remove any excess dielectric fill material.

Figure 7B:
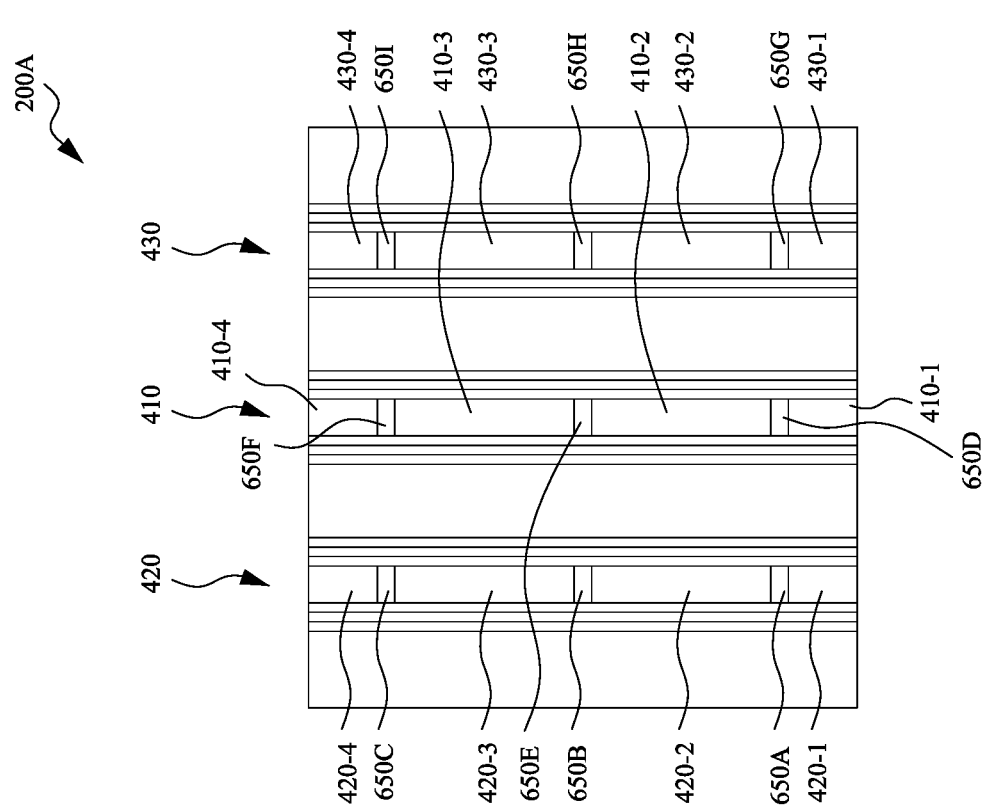
Figure 7A:
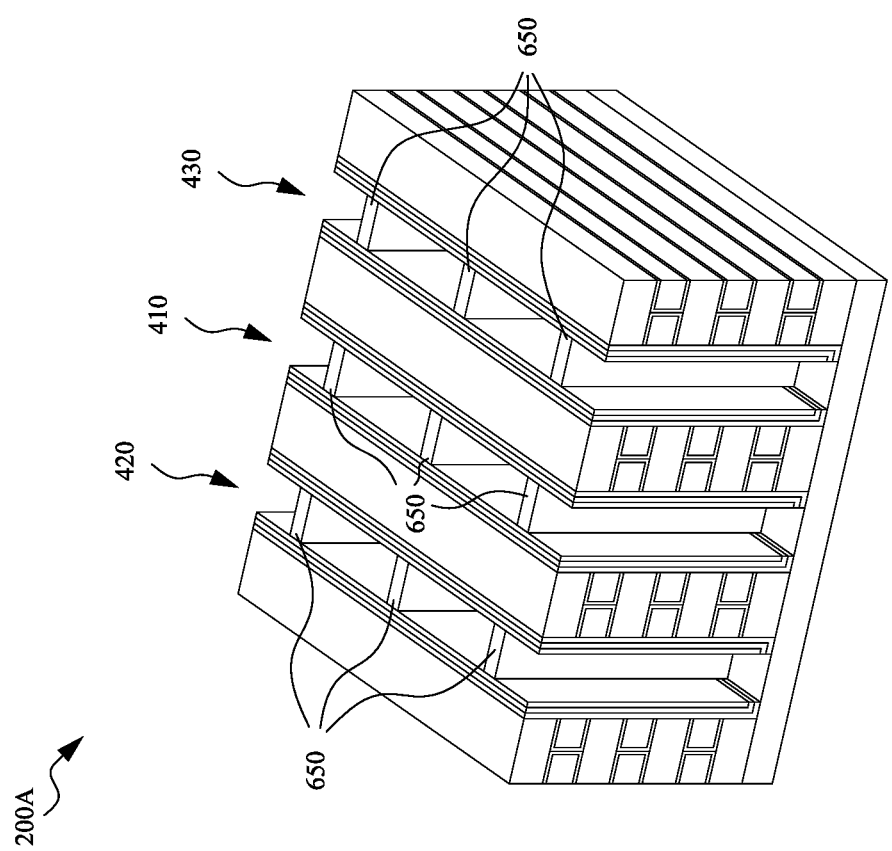

Corresponding to operation 112 of FIG. 1, FIG. 7A is a perspective view of the 3D memory device 200A in which the dielectric fill material 650 in each of the trenches 410 through 430 is patterned at one of the various stages of fabrication, in accordance with various embodiments. Further, FIG. 7B is a top view of the 3D memory device 200A, corresponding to FIG. 7A.

The dielectric fill material 650 may be patterned to define initial footprints of a number of bit lines (BLs) and source lines (SLs), which will be discussed in further detail below. As shown in FIG. 7B, in the trench 420, the dielectric fill material 650 is patterned (or otherwise separated) by, for example, an anisotropic etching process to form various trench portions 420-1, 420-2, 420-3, and 420-4; in the trench 410, the dielectric fill material 650 is patterned (or otherwise separated) by, for example, an anisotropic etching process to form various trench portions 410-1, 410-2, 410-3, and 410-4; and in the trench 430, the dielectric fill material 650 is patterned (or otherwise separated) by, for example, an anisotropic etching process to form various trench portions 430-1, 430-2, 430-3, and 430-4.

Alternatively stated, in each of the trenches, the trench portions are separated from one another by various remaining portions of the dielectric fill material 650. Such a remaining portion of the dielectric fill material 650 can be configured to electrically isolate the bit line (BL) and source line (SL) of each memory cell of a certain string of the memory device 200 from each other, which will be discussed in further detail below. As shown in FIG. 7B, in the trench 420, the remaining portions of the dielectric fill material 650 (hereinafter "650A, 650B, and 650C") are each disposed between the adjacent ones of the trench portions; in the trench 410, the remaining portions of the dielectric fill material 650 (hereinafter "650D, 650E, and 650F") are each disposed between the adjacent ones of the trench portions; and in the trench 430, the remaining portions of the dielectric fill material 650 (hereinafter "650G, 650H, and 650I") are each disposed between the adjacent ones of the trench portions.

Figure 8B:
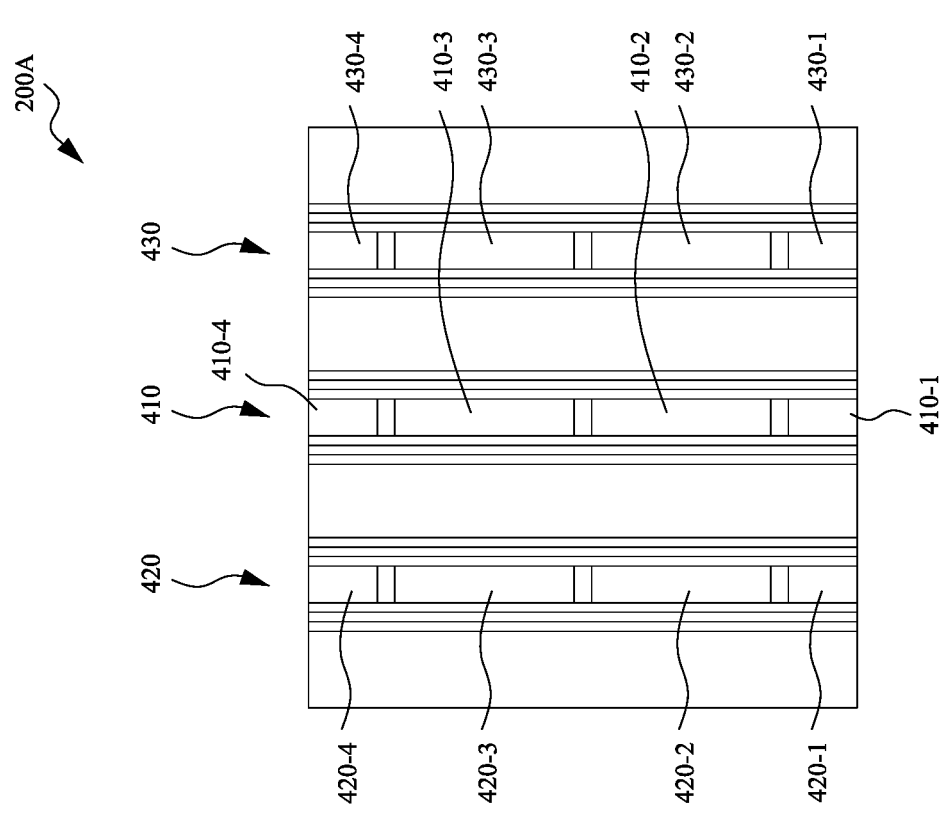
Figure 8A:
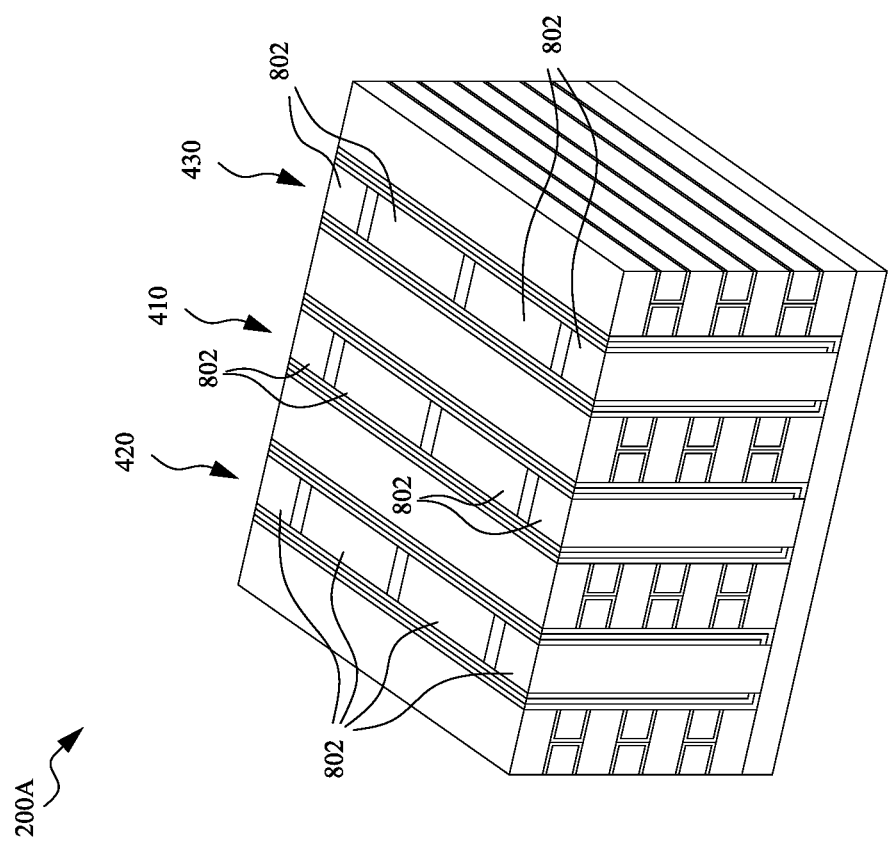

Corresponding to operation 114 of FIG. 1, FIG. 8A is a perspective view of the 3D memory device 200A in which the trench portions are filled out with a dummy dielectric material 802 at one of the various stages of fabrication, in accordance with various embodiments. Further, FIG. 8B is a top view of the 3D memory device 200A, corresponding to FIG. 8A.

As shown in FIGS. 8A-B, a dummy dielectric material 802 is deposited over the workpiece to fill out the trench portions 420-1 to 420-4, 410-1 to 410-4, and 430-1 to 430-4, followed by a CMP process. The dummy dielectric material 802 can be formed by chemical vapor deposition (CVD), plasma enhanced CVD (PECVD), low pressure CVD (LPCVD), or other deposition techniques. In various embodiments, the dummy dielectric material 802 include an insulating material which is a sacrificial material that can be subsequently removed. Non-limiting examples of the dummy dielectric material 802 include silicon nitride, an amorphous semiconductor material (such as amorphous silicon), and a polycrystalline semiconductor material (such as polysilicon). In one embodiment, the dummy dielectric material 802 can be spacer material layers that include silicon nitride or a semiconductor material including at least one of silicon or germanium.

Figure 9B:
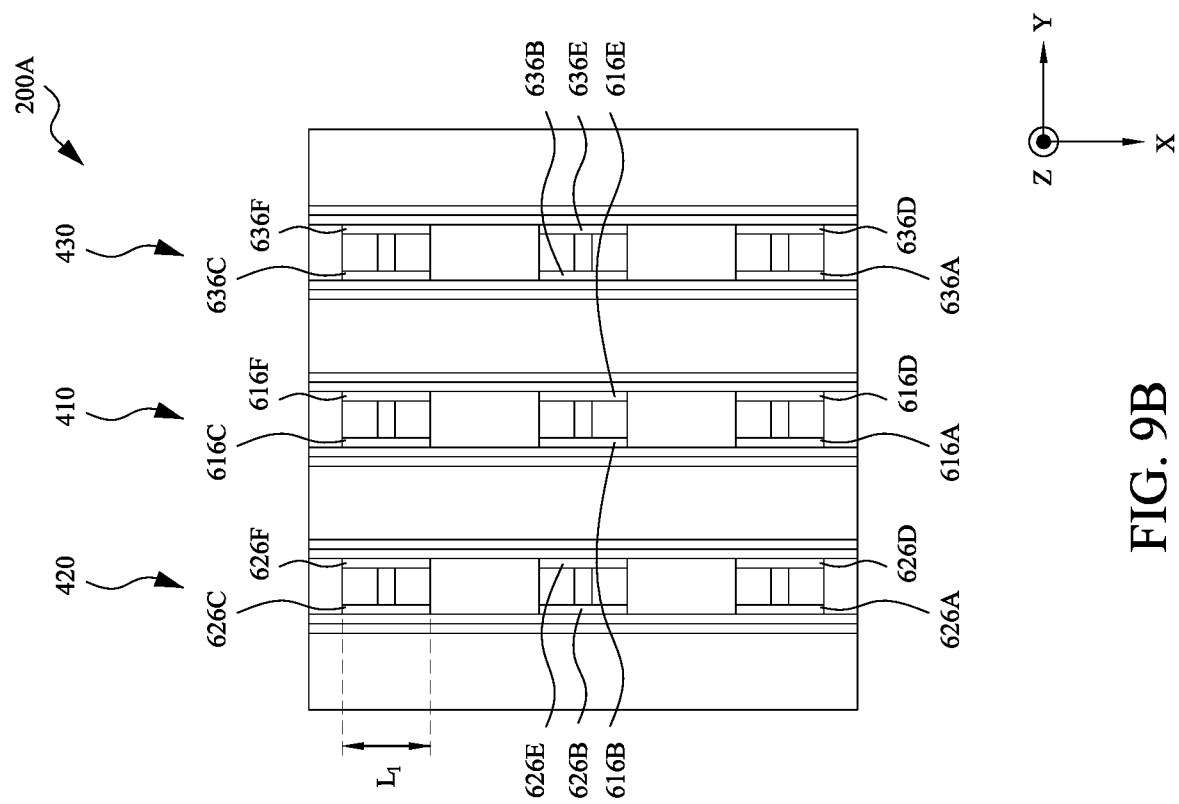
Figure 9A:
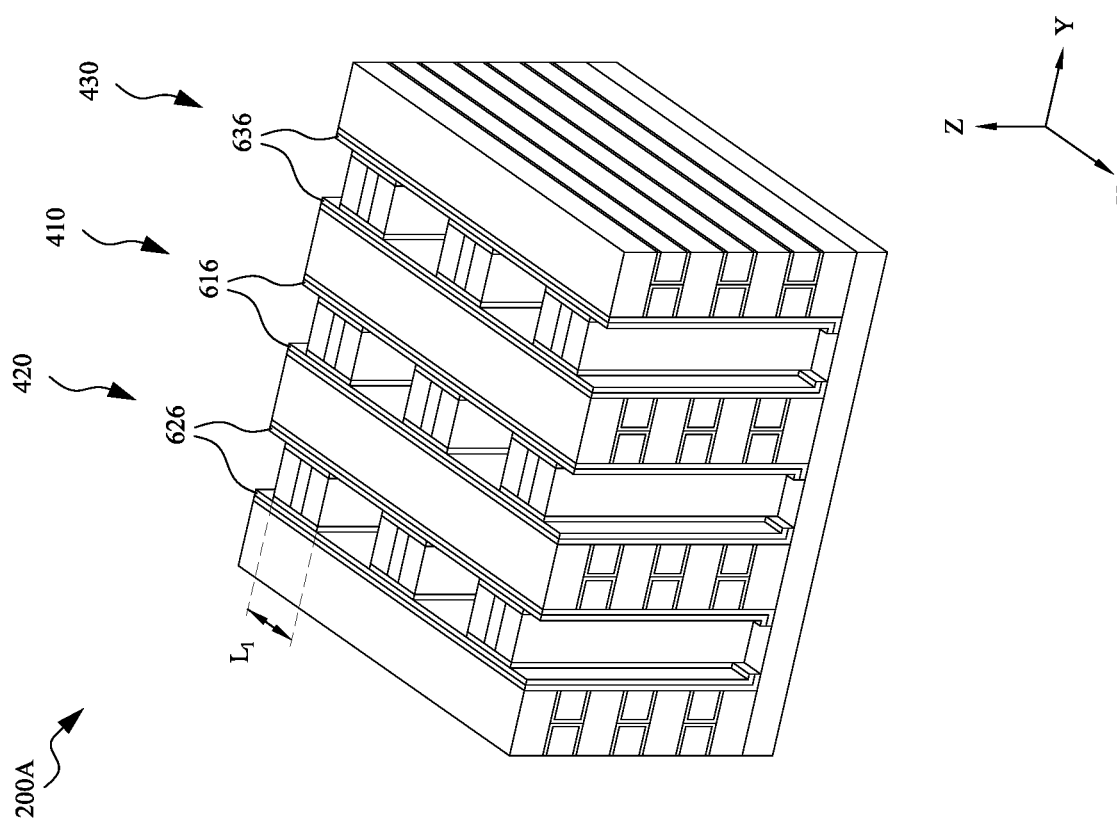

Corresponding to operation 116 of FIG. 1, FIG. 9A is a perspective view of the 3D memory device 200A in which the gate dielectric layers 616, 626, and 636 are patterned at one of the various stages of fabrication, in accordance with various embodiments. Further, FIG. 9B is a top view of the 3D memory device 200A, corresponding to FIG. 9A.

As shown in FIG. 9A, the gate dielectric layers 616, 626, and 636 are each patterned by, for example, an anisotropic etching process to form a number of portions. In various embodiments, each of such gate dielectric segments may extend along a lateral direction (e.g., the X direction) with a length ($L_1$), which may be configured to define the effective conduction channel length of a memory cell. As better seen in FIG. 9B, in the trench 420, the gate dielectric layer 626 is patterned to form a number of gate dielectric segments 626A, 626B, 626C, 626D, 626E, and 626F; in the trench 410, the gate dielectric layer 616 is patterned to form a number of gate dielectric segments 616A, 616B, 616C, 616D, 616E, and 616F; and in the trench 430, the gate dielectric layer 636 is patterned to form a number of gate dielectric segments 636A, 636B, 636C, 636D, 636E, and 636F.

Figure 10B:
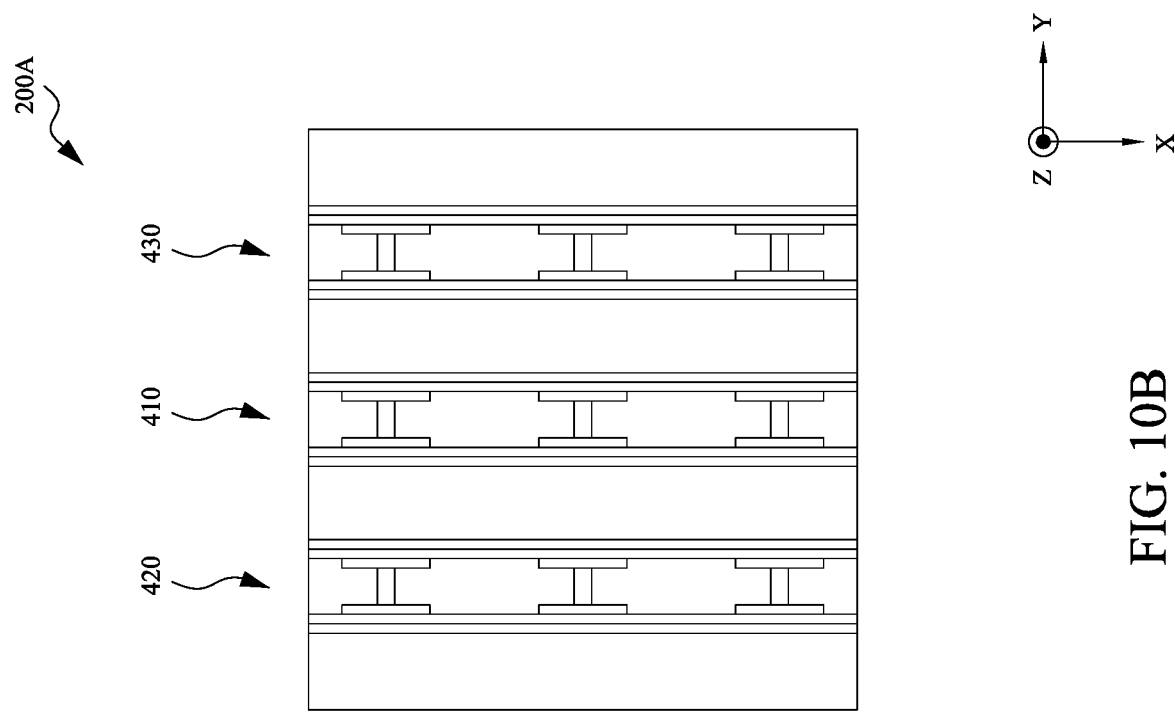
Figure 10A:
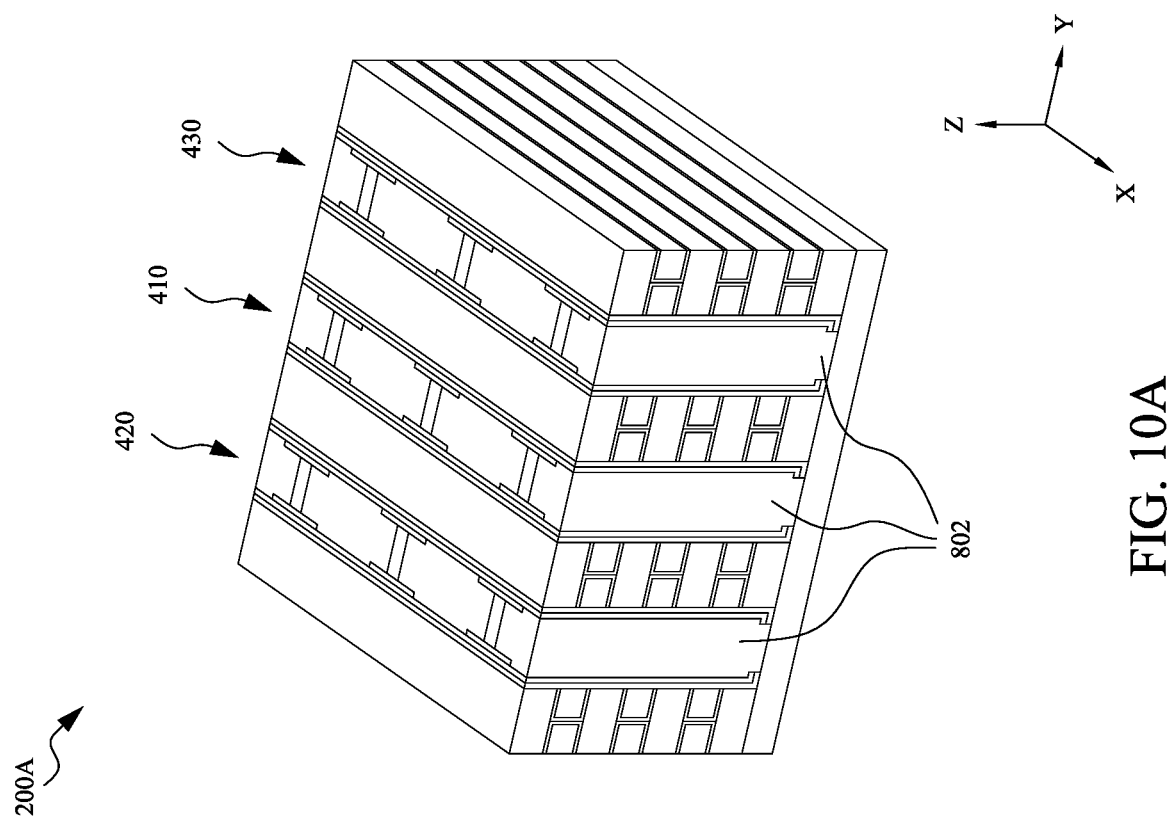

Corresponding to operation 118 of FIG. 1, FIG. 10A is a perspective view of the 3D memory device 200A in which the trenches 410 through 430 are again filled out by the dummy dielectric material 802 at one of the various stages of fabrication, in accordance with various embodiments. Further, FIG. 10B is a top view of the 3D memory device 200A, corresponding to FIG. 10A. Upon forming the gate dielectric segments (thereby exposing portions of the trenches 410 through 430), such exposed portions of the trenches 410 through 430 may be again filled out by the dummy dielectric material 802, followed by a CMP process.

Figure 11B:
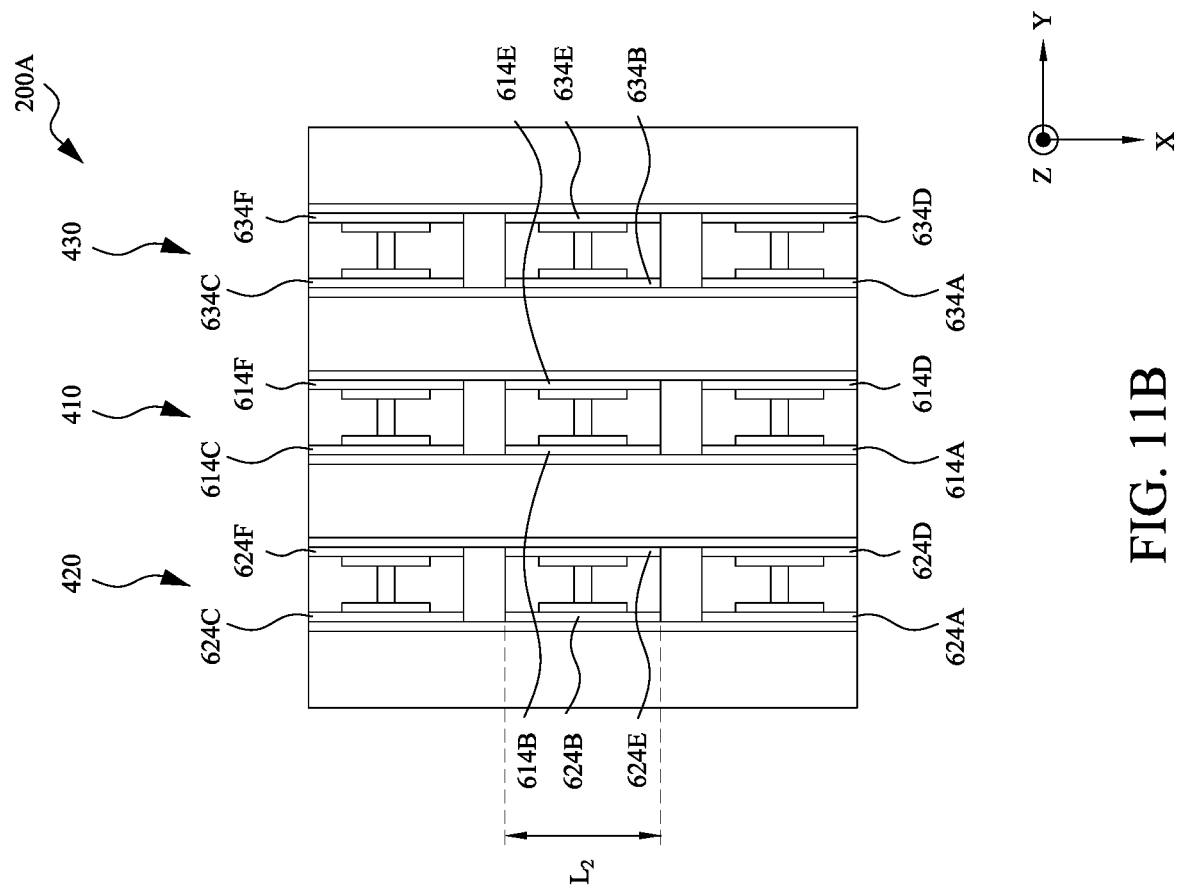
Figure 11A:
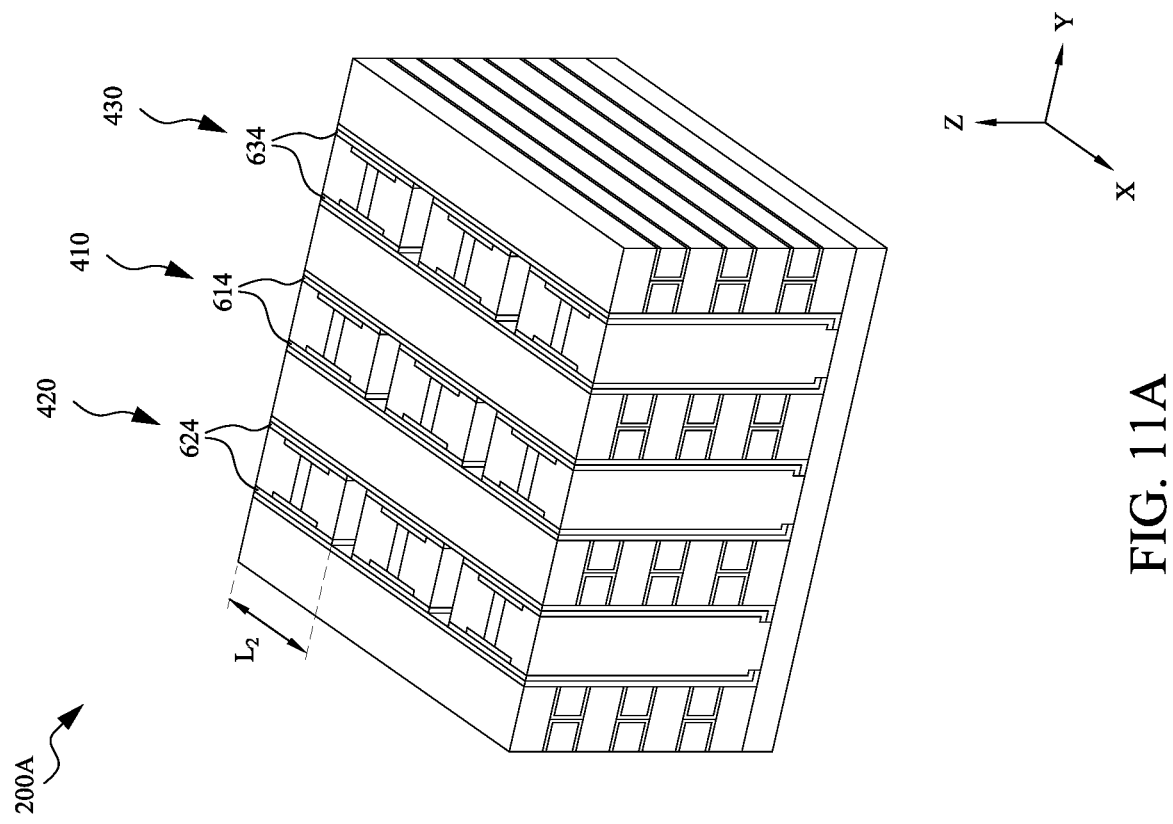

Corresponding to operation 120 of FIG. 1, FIG. 11A is a perspective view of the 3D memory device 200A in which the channel layers 614, 624, 634 are patterned at one of the various stages of fabrication, in accordance with various embodiments. Further, FIG. 11B is a top view of the 3D memory device 200A, corresponding to FIG. 11A.

As shown in FIG. 11A, the channel layers 614, 624, and 634 are each patterned by, for example, an anisotropic etching process to form a number of portions. In various embodiments, each of such channel segments may extend along a lateral direction (e.g., the X direction) with a length ($L_2$), which may be configured to define the physical channel length of a memory cell. Such a physical channel length ($L_2$) may be longer than the length ($L_1$) of the gate dielectric segment. As better seen in FIG. 11B, in the trench 420, the channel layer 624 is patterned to form a number of channel segments 624A, 624B, 624C, 624D, 624E, and 626F; in the trench 410, the channel layer 614 is patterned to form a number of channel segments 614A, 614B, 614C, 614D, 614E, and 614F; and in the trench 430, the channel layer 634 is patterned to form a number of channel segments 634A, 634B, 634C, 634D, 634E, and 634F.

Figure 12B:
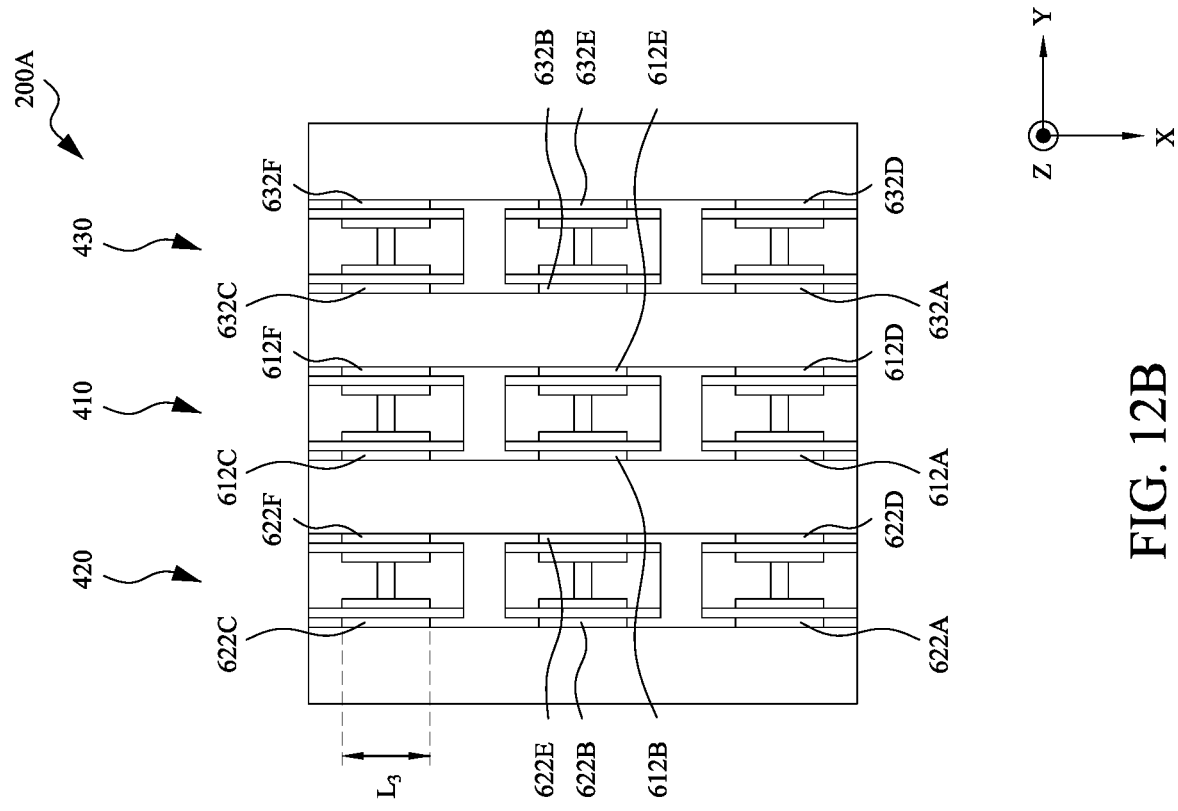
Figure 12A:
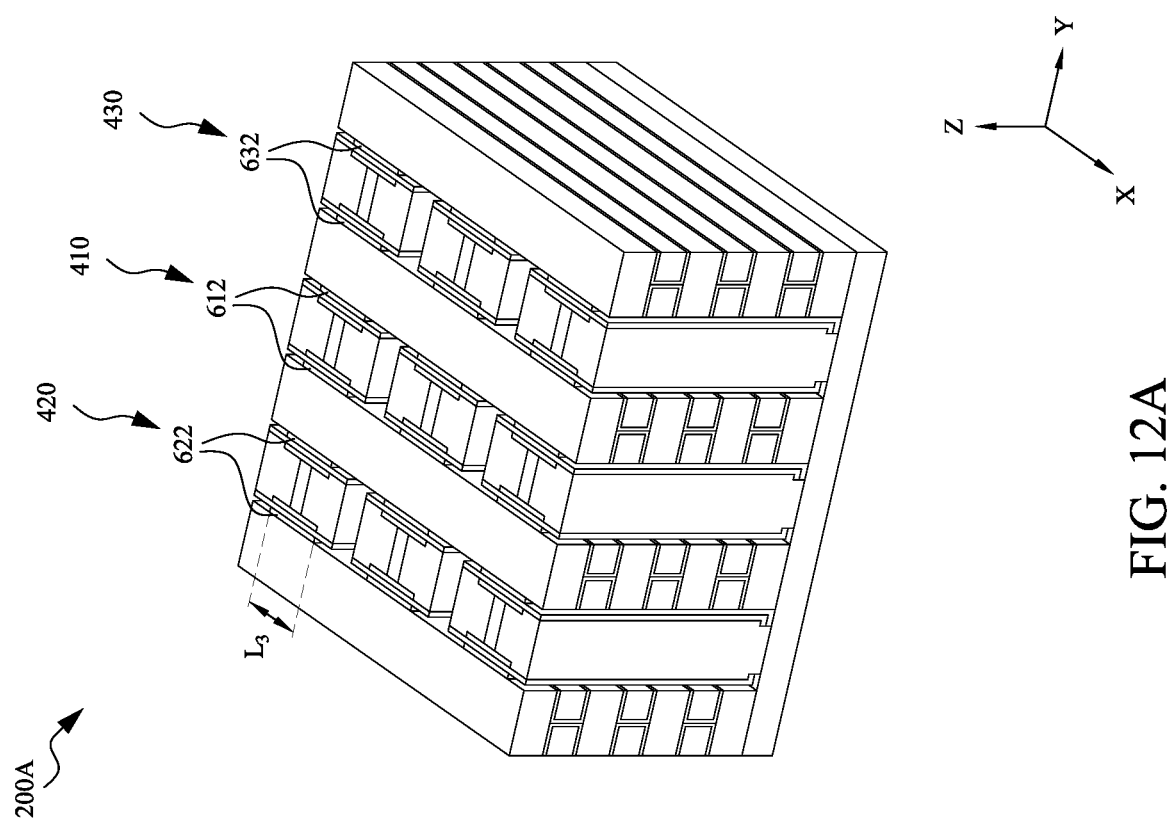

Corresponding to operation 122 of FIG. 1, FIG. 12A is a perspective view of the 3D memory device 200A in which the ferroelectric layers 612, 622, 632 are patterned at one of the various stages of fabrication, in accordance with various embodiments. Further, FIG. 12B is a top view of the 3D memory device 200A, corresponding to FIG. 12A.

As shown in FIG. 12A, the ferroelectric layers 612, 622, and 632 are each patterned by, for example, an anisotropic etching process to form a number of portions. In various embodiments, each of such ferroelectric segments may extend along a lateral direction (e.g., the X direction) with a length ($L_3$). Such a length ($L_3$) may be shorter than the physical length of the channel segment ($L_2$), and less than, equal to, or greater than the length ($L_1$) of the gate dielectric segment. As better seen in FIG. 12B, in the trench 420, the ferroelectric layer 622 is patterned to form a number of ferroelectric segments 622A, 622B, 622C, 622D, 622E, and 622F; in the trench 410, the ferroelectric layer 612 is patterned to form a number of ferroelectric segments 612A, 612B, 612C, 612D, 612E, and 612F; and in the trench 430, the ferroelectric layer 632 is patterned to form a number of ferroelectric segments 632A, 632B, 632C, 632D, 632E, and 632F.

Figure 13B:
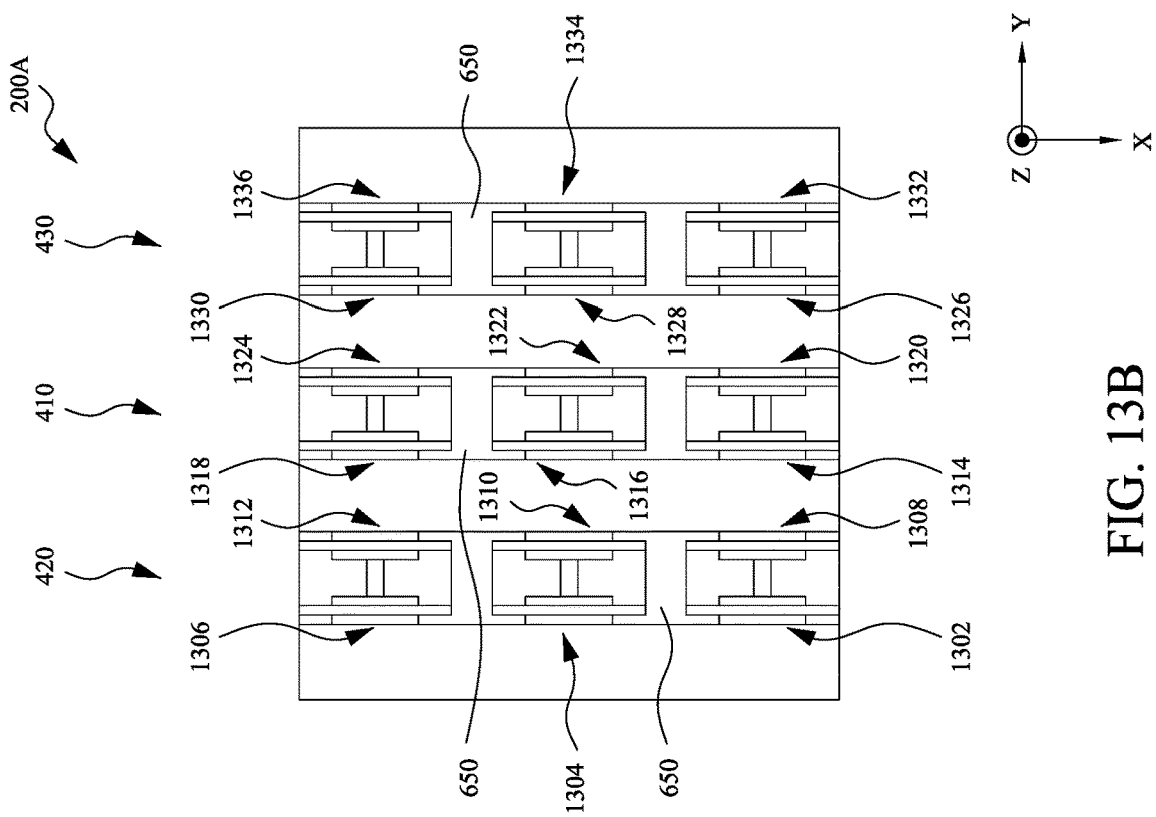
Figure 13A:
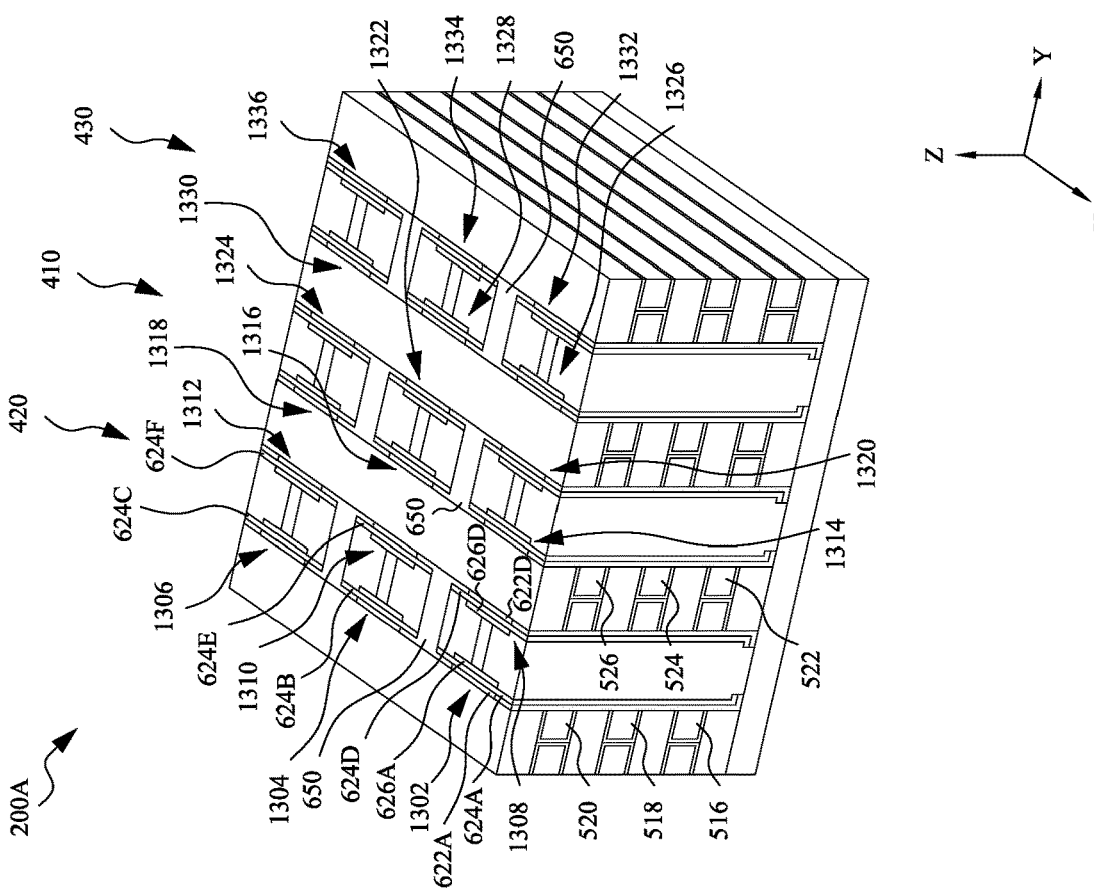

Corresponding to operation 124 of FIG. 1, FIG. 13A is a perspective view of the 3D memory device 200A in which the trenches 410 through 430 are again filled out by the dielectric fill material 650 at one of the various stages of fabrication, in accordance with various embodiments. Further, FIG. 13B is a top view of the 3D memory device 200A, corresponding to FIG. 13A.

Upon forming the ferroelectric segments (thereby further exposing portions of the trenches 410 through 430), such exposed portions of the trenches 410 through 430 may be again filled out by the dielectric fill material 650, followed by a CMP process. By filling the trenches 410 through 430 with the dielectric fill material 650, a gap present between the WLs (that extends along the X direction) and each of the channel segments can be (e.g., electrically) isolated by the dielectric fill material 650. As some representative examples, the gaps between the WLs 516 to 520 and the channel segments 624A to 624C can be filled by the dielectric fill material 650; and the gaps between the WLs 522 to 526 and the channel segments 624D to 624F can be filled by the dielectric fill material 650.

Upon filling the trenches 410 through 430 with the dielectric fill material 650, a number of memory strings can be formed (or isolated). For example in FIG. 13A, a first memory string 1302 can be formed by the ferroelectric segment 622A, channel segment 624A, and gate dielectric segment 626A. The first memory string 1302 includes three memory cells vertically disposed at three different tiers, which are controlled (e.g., gated) by the WLs 516 to 520, respectively. Similarly, a number of memory strings (e.g., 1304, 1306, 1308, 1310, 1312, 1314, 1316, 1318, 1320, 1322, 1324, 1326, 1328, 1330, 1332, 1334, and 1336) can each be formed by the respective ferroelectric segment, channel segment, and gate dielectric segment. Further, each memory cell includes a region (or portion) of one of the vertically extending ferroelectric segments, a region (or portion) of one of the vertically extending channel segments, and a region (or portion) of the vertically extending gate dielectric segments. In the illustrated example of FIG. 13A (where three tiers are shown), each of these memory strings includes three memory cells vertically disposed at three different tiers, which are controlled (e.g., gated) by the respective WLs.

Figure 14B:
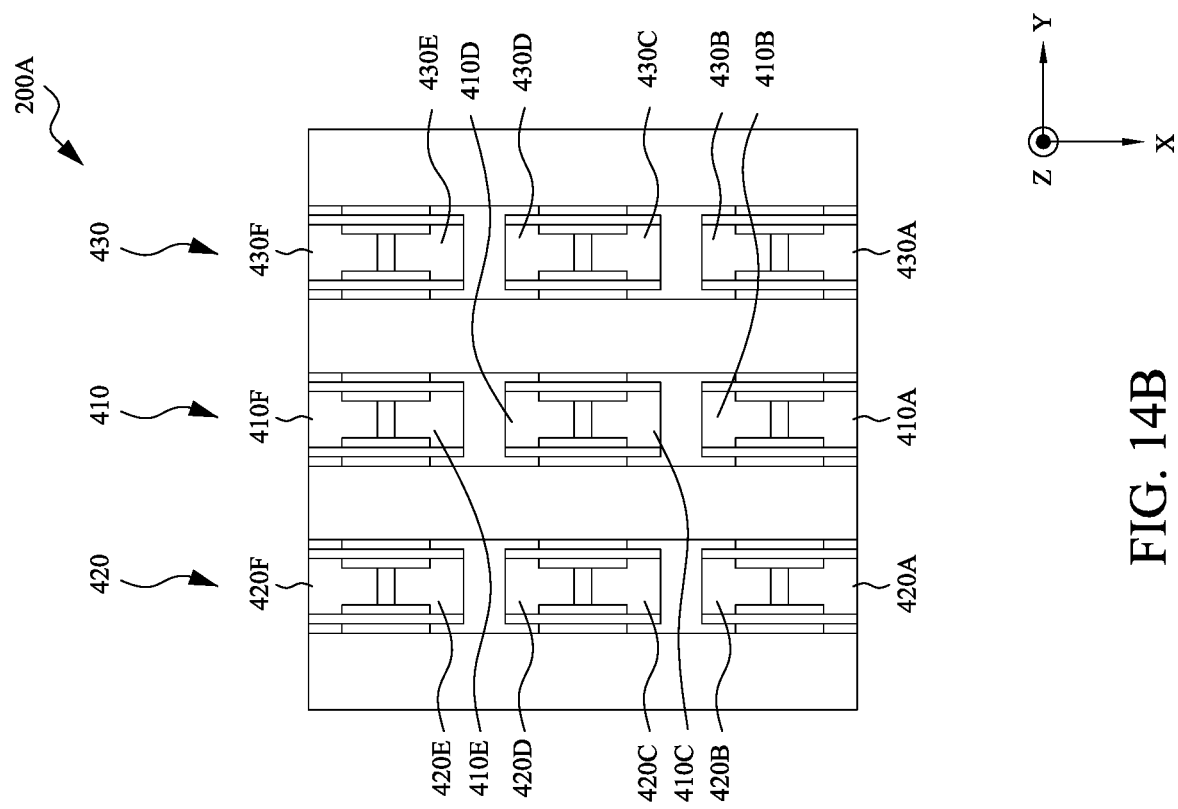
Figure 14A:
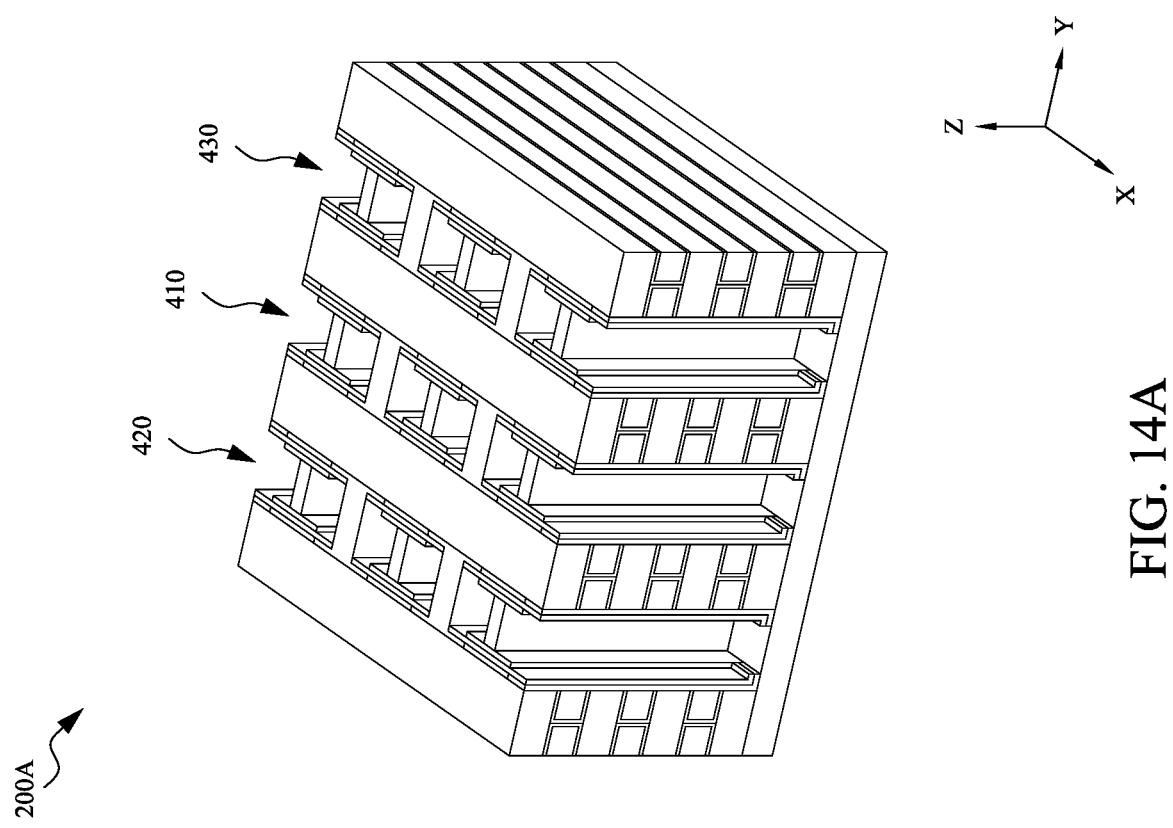

Corresponding to operation 126 of FIG. 1, FIG. 14A is a perspective view of the 3D memory device 200A in which the remaining portions of the dummy dielectric material 802 are removed at one of the various stages of fabrication, in accordance with various embodiments. Further, FIG. 14B is a top view of the 3D memory device 200A, corresponding to FIG. 14A.

By removing the remaining portions of the dummy dielectric material 802, a number of trench portions along each of the trenches 410 through 430 can be formed. As better illustrated in FIG. 14B, along the trench 420, trench portions 420A, 420B, 420C, 420D, 420E, and 420F are formed; along the trench 410, trench portions 410A, 410B, 410C, 410D, 410E, and 410F are formed; and along the trench 430, trench portions 430A, 430B, 430C, 430D, 430E, and 430F are formed. In various embodiments, the remaining portions of the dummy dielectric material 802 may be removed by applying a wet etching process over the workpiece, which is selective to the dummy dielectric material 802 (while leaving the ferroelectric segments, channel segments, and gate dielectric segments substantially intact).

Figures 15A, 15B:
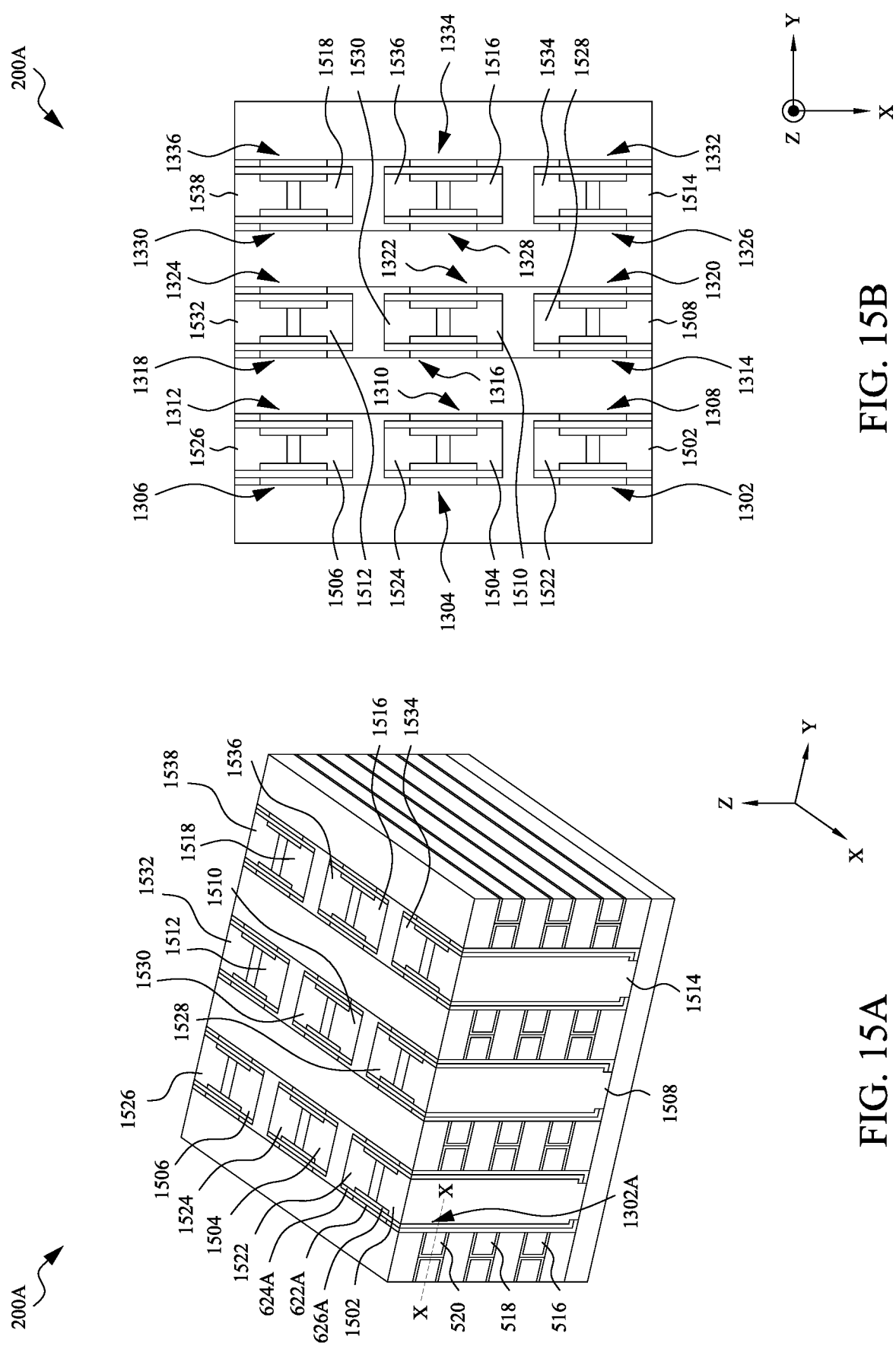

Corresponding to operation 128 of FIG. 1, FIG. 15A is a perspective view of the 3D memory device 200A including a number of BLs, 1502, 1504, 1506, 1508, 1510, 1512, 1514, 1516, and 1518, and a number of SLs, 1522, 1524, 1526, 1528, 1530, 1532, 1534, 1536, and 1538, at one of the various stages of fabrication, in accordance with various embodiments. Further, FIG. 15B is a top view of the 3D memory device 200A, corresponding to FIG. 15A.

The BLs 1502 through 1518 and SLs 1522 through 1538 can be formed by filling the trench portions 410A to 410F, 420A to 420F, and 430A to 430F (FIG. 14B), respectively, with a metal material. The metal material can be selected from the group consisting of tungsten, copper, cobalt, ruthenium, titanium, tantalum, or combinations thereof. The metal material can be deposited by a conformal deposition method, which can be, for example, chemical vapor deposition (CVD), atomic layer deposition (ALD), electroless plating, electroplating, or a combination thereof.

Upon forming the BLs 1502-1518 and SLs 1522-1538, each memory cell of the memory strings 1302 through 1336 can be accessed through its respective WL, BL, and SL. For example, the memory cell of the 3D memory device 200 can be written (i.e., programmed or erased), and a ferroelectric state of the memory cell can be read (i.e., sensed) in the following manner. Each memory cell can include a region (or portion) of one of the vertically extending ferroelectric segments (e.g., 612A-F, 622A-F, and 632A-F, as shown in FIG. 12B) located between a selected one of the WLs (e.g., 510-556, as shown in FIG. 6A) and a selected one of the vertically extending channel segments (e.g., 614A-F, 624A-F, and 634A-F, as shown in FIG. 11B). In the following discussion, the memory cell along the memory string 1302 at the third tier (hereinafter "memory cell 1302A") is selected as a representative example for being written and read.

In case the channel segment 624A include a p-doped semiconductor material, and the minority charge carriers in the p-doped semiconductor channel are electrons, the selected memory cell 1302A can be programmed into a programmed (i.e., ON) state that locally decreases a threshold voltage inside the selected one of the channel segment 624A and at a level of the selected WL 520 by applying: (1) a current flow bias voltage across the BL 1502 and the SL 1522 located on the ends of the selected channel segment 624A; (2) a selected word line voltage to the selected WL 520, wherein the selected word line voltage is a greater positive voltage with respect to voltages applied to the BL 1502 and the SL 1522; and (3) an unselected word line voltage that is less positive than the selected word line voltage to each of the unselected WLs (e.g., 516, 518). In a non-limiting example, the SL 1522 can be biased at 0 V, the BL 1502 can be biased at 2.0 V, the selected WL 520 can be biased at 5 V, and the unselected WLs can be biased at 2.5 V. This programming step sets the channel threshold voltage adjacent to the programmed memory cell 1302A (i.e., adjacent to the selected WL 520) to a relatively low value, such as 0 V.

Continuing with the same example, the selected memory cell 1302A can be programmed into an erased (i.e., OFF) state that increases a threshold voltage inside the selected one of the channel segment 624A and at a level of the selected WL 520 by applying: (1) a current flow bias voltage across the BL 1502 and the SL 1522 located on the ends of the selected channel segment 624A; (2) a selected word line voltage to the selected WL 520, wherein the selected word line voltage is a negative voltage with respect to at least one of voltages applied to the BL 1502 and the SL 1522; and (3) an unselected word line voltage to unselected WLs (e.g., 516, 518) that is more positive than the voltages applied to the BL 1502 and the SL 1522. In a non-limiting example, the SL 1522 can be biased at 5 V, the BL 1502 can be biased at 5 V, the selected WL 520 can be biased at 0 V, and the unselected WLs can be biased at 7.5 V. This erasing step sets the channel threshold voltage adjacent to the programmed memory cell 1302A (i.e., adjacent to the selected WL 520) to a relatively higher value, such as 1 V, which is higher than in the programmed.

The ON or OFF state of the selected memory cell 1302A can be read by applying: (1) a current flow bias voltage across the BL 1502 and the SL 1522; (2) a selected word line voltage to the selected WL 520, wherein the selected word line voltage is at one of, or is between, voltages applied to the BL 1502 and the SL 1522; and (3) an unselected word line voltage applied to the unselected WLs that is more positive than the voltages applied to the selected WL 520, the BL 1502, and the SL 1522. In a non-limiting example, the SL 1522 can be biased at 0 V, the BL 1502 can be biased at 1 to 2 V, the WL 520 can be biased at 1 to 1.5 V, and the unselected WLs can be biased at 2.5 V (one half of the programming voltage applied to the selected WL 520). This provides a voltage between the BL 1502 and the SL 1522 that is greater than the threshold voltage of the channel in the erased memory cells to keep the current flowing in the channel between the BL 1502 and the SL 1522.

Figure 16:
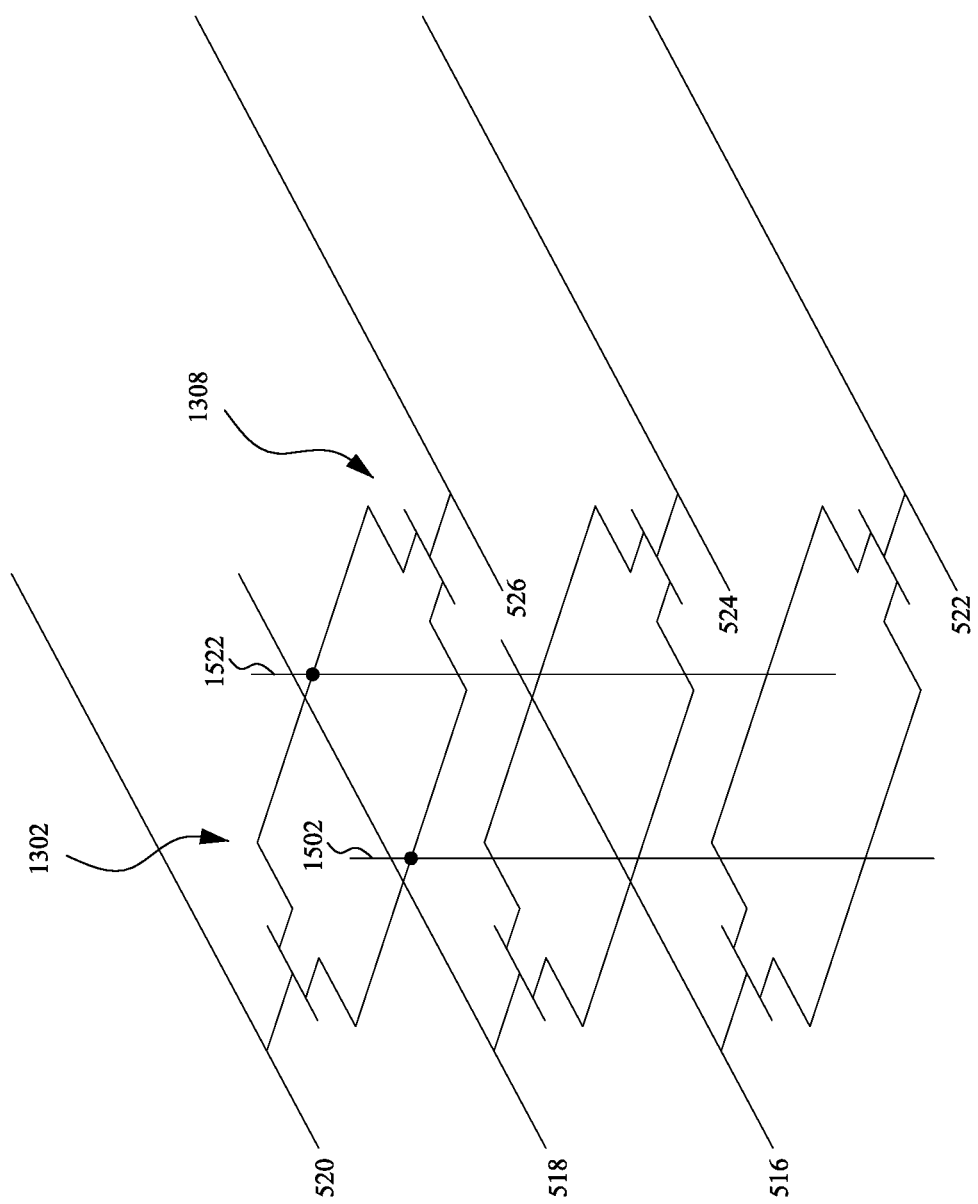
FIG. 16 illustrates a schematic circuit diagram of the example three-dimensional memory device of FIGS. 3 through 15B, in accordance with some embodiments.

FIG. 16 illustrates a schematic circuit diagram of a portion of the 3D memory device 200A, in accordance with various embodiments. In FIG. 16, the memory strings 1302 and 1308 that share the same BL (e.g., 1502) and WL (e.g., 1522) are shown. Each of the memory cells may be represented by a transistor, in which each memory cell can be accessed by a respective combination of WL, BL, and SL. For example, in order to access the top one of the memory cells of the memory string 1302, the WL 520 may be asserted to select that memory cell, with the BL 1502 and the SL 1522 applied with suitable levels of signals, as described above. In another example, in order to access the bottom one of the memory cells of the memory string 1308, the WL 522 may be asserted to select that memory cell, with BL 1502 and 1522 applied with suitable levels of signals, as described above.

Figure 17A:
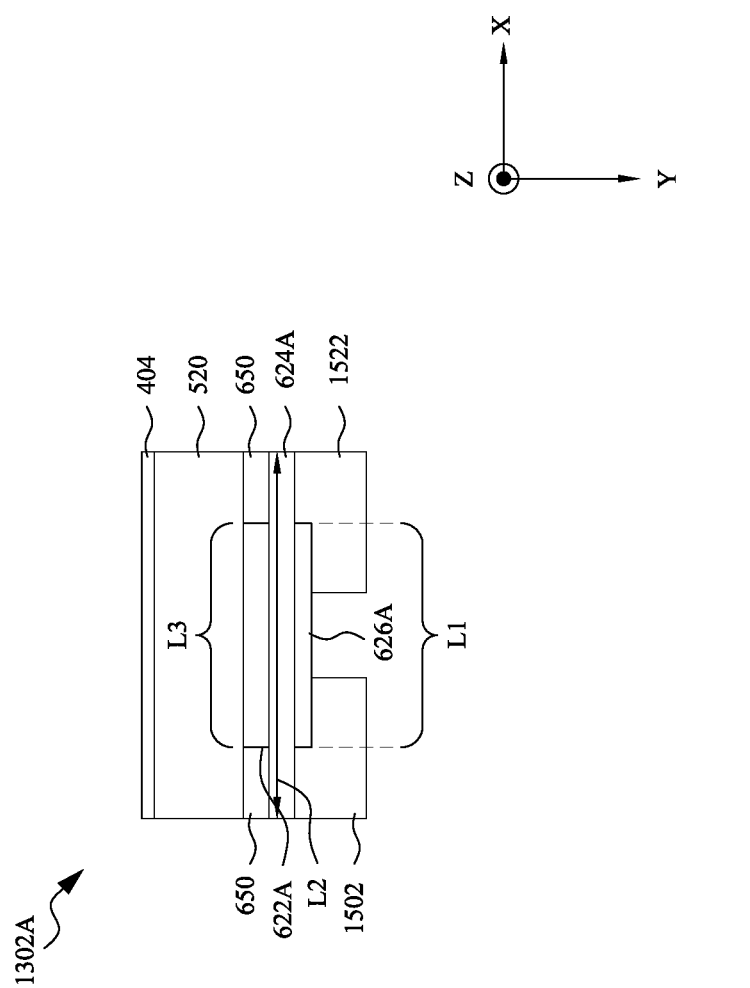

FIG. 17A illustrates a cross-sectional view of the memory cell 1302A, cut along line X-X (as indicated in FIG. 15A), in accordance with various embodiments. FIGS. 17B, 17C, 17D, 17E, 17F, 17G, 17H, and 17I illustrate cross-sectional views of the memory cell 1302A, cut along line X-X, respectively, in accordance with various other embodiments.

Referring first to FIG. 17A, the memory cell 1302A includes a portion of the channel segment 624A sandwiched by a portion of the ferroelectric segment 622A and a portion of the gate dielectric segment 626A. The WL 520 is (e.g., electrically) coupled to the portion of the channel segment 624A via the portion of the ferroelectric segment 622A; and the BL 1502 and SL 1522 is (e.g., electrically) coupled to the channel segment 624A, with portions of the gate dielectric segment 626A coupled between the channel segment 624A and the BL 1502, and between the channel segment 624A and the SL 1522. In various embodiments, the ferroelectric segment 622A has a length/width ($L_3$) shorter than a length/width ($L_2$) of the channel segment 624A, and about equal to a length/width ($L_1$) of the gate dielectric segment 626A. Further, the ends of the ferroelectric segment 622A approximately align with the ends of the gate dielectric segment 626A, respectively.

FIG. 17B illustrates another embodiment of the memory cell 1302A in which the ferroelectric segment 622A is longer than and centrally aligned with the gate dielectric segment 626A; FIG. 17C illustrates yet another embodiment of the memory cell 1302A in which the ferroelectric segment 622A is shorter than and centrally aligned with the gate dielectric segment 626A; FIG. 17D illustrates yet another embodiment of the memory cell 1302A in which the ferroelectric segment 622A is longer than but centrally aligned with the gate dielectric segment 626A; FIG. 17E illustrates yet another embodiment of the memory cell 1302A in which the ferroelectric segment 622A is about equal to but centrally misaligned from the gate dielectric segment 626A; FIG. 17F illustrates yet another embodiment of the memory cell 1302A in which the ferroelectric segment 622A is less than the gate dielectric segment 626A (while one of the ends of the ferroelectric segment 622A and one of the ends of the gate dielectric segment 626A is still aligned). As used herein, the term "centrally aligned" refers to two objects, either in direct or indirect contact with each other, with their respective central points being aligned along a vertical line.

FIGS. 17G-I illustrate different profiles of the channel segment 624A, respectively. In FIG. 17G, the channel segment 624A has tapered side portions, each of which has a decreasing thickness (t) toward the end (e.g., along the X direction) following a straight line; in FIG. 17H, the channel segment 624A has tapered side portions, each of which has a decreasing thickness (t) toward the end (e.g., along the X direction) following a curvature-based line; and in FIG. 17I, the channel segment 624A has step-like side portions, each of which has an abrupt change of the thickness (Δt) toward the end (e.g., along the X direction).

In any of the various configurations of the memory cell discussed above, the ferroelectric segment is formed shorter than the channel segment, which causes the gaps located between the WL and channel segment, on opposite ends of the ferroelectric segment, to be filled with a dielectric material that has a relatively low dielectric constant. In the ferroelectric memory cells that do not implement the embodiments of the present disclosure, such a gap is filled with the ferroelectric segment, which is typically characterized with a relatively higher dielectric constant. As such, the capacitance between any of the SL or BL and the WL may be disadvantageously increased. By filling the gap with a dielectric material having a low dielectric constant, such high capacitive coupling between the SL/BL and the WL can be significantly decreased, which can improve overall performance (e.g., speed) of the memory cell.

Figure 18:
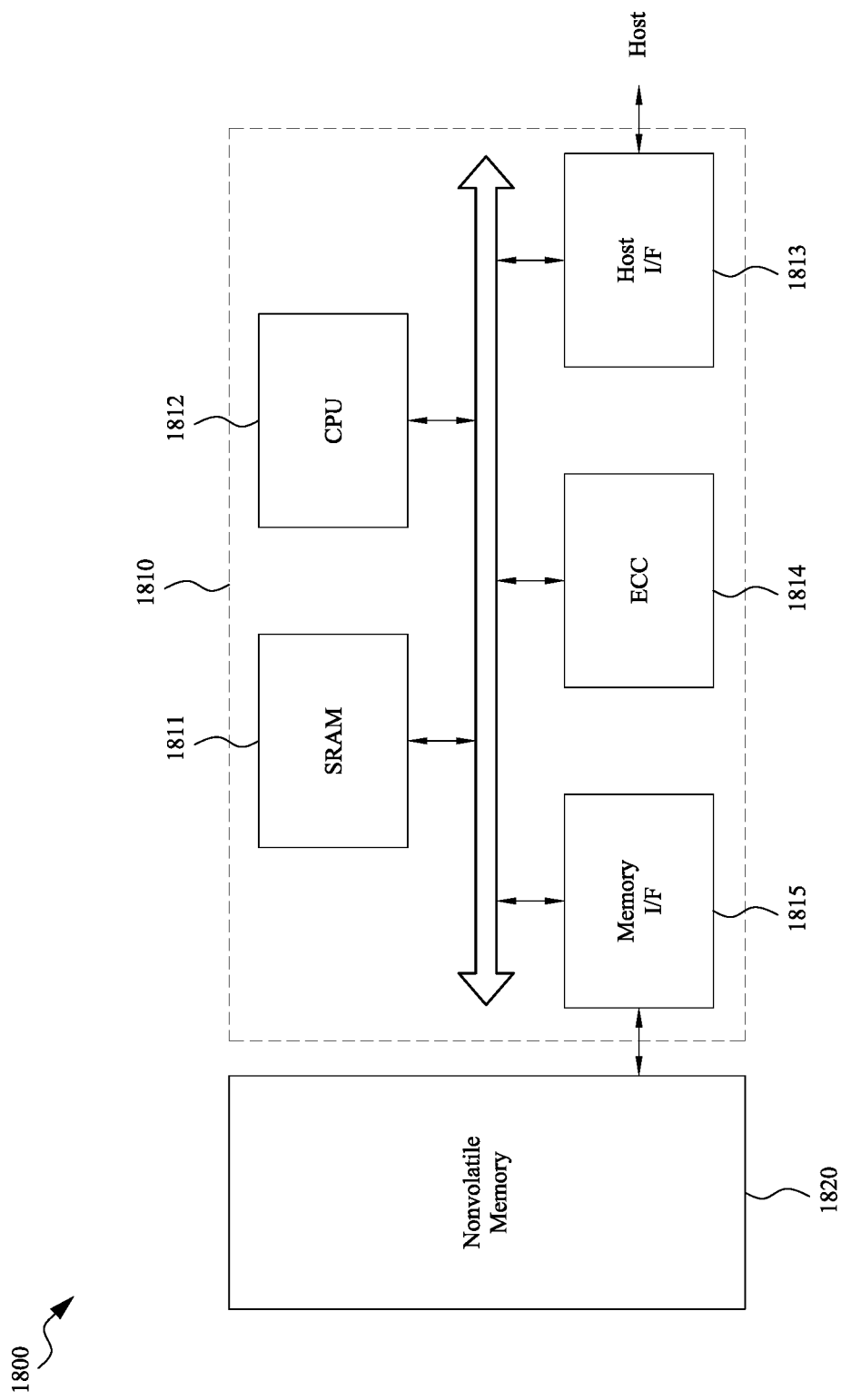
FIG. 18 illustrates a block diagram of an example configuration a memory system that includes the three-dimensional memory device, as disclosed herein, in accordance with some embodiments.

FIG. 18 is a block diagram showing the configuration of a memory system, according to various embodiment of the present disclosure. As shown, a memory system 1800 according to various embodiments of the present disclosure includes a non-volatile memory device 1820 and a memory controller 1810.

The non-volatile memory device 1820 may include the 3D memory device, as disclosed herein. In addition, the non-volatile memory device 1820 may be a multi-chip package composed of a number of ferroelectric memory chips.

The memory controller 1810 is configured to control the non-volatile memory device 1820. The memory controller 1810 may include SRAM 1811, a CPU 1812, a host interface 1813, an ECC 1814 and a memory interface 1815. The SRAM 1811 functions as an operation memory of the CPU 1812. The CPU 1812 performs the general control operation for data exchange of the memory controller 1810. The host interface 1813 includes a data exchange protocol of a host being coupled to the memory system 1800. In addition, the ECC 1814 may detect and correct errors included in a data read from the non-volatile memory device 1820. The memory interface 1815 interfaces with the non-volatile memory device 1820. The memory controller 1810 may further store code data to interface with the host.

In one aspect of the present disclosure, a memory device is disclosed. The memory device includes a plurality of first memory cells disposed along a vertical direction. Each of the plurality of first memory cells includes a portion of a first channel segment that extends along the vertical direction and has a first sidewall and a second sidewall. The first and second sidewalls of the first channel segment facing toward and away from a first lateral direction, respectively. Each of the plurality of first memory cells includes a portion of a first ferroelectric segment that also extends along the vertical direction and is in contact with the first sidewall of the first channel segment. A width of the first ferroelectric segment along a second lateral direction is different from a width of the first channel segment along the second lateral direction, the second lateral direction perpendicular to the first lateral direction.

In another aspect of the present disclosure, a semiconductor device is disclosed. The semiconductor device includes a semiconductor channel segment that extends along a vertical direction and has a first width along a first lateral direction. The semiconductor channel segment has a first sidewall and a second sidewall that face toward and away from a second lateral direction perpendicular to the first lateral direction, respectively. The semiconductor device includes a ferroelectric segment that also extends along the vertical direction, wherein the ferroelectric segment is coupled to the semiconductor channel segment through the first sidewall, and has a second width along the first lateral direction, the second width being different from the first width. The semiconductor device includes a plurality of first conductive structures separated from each other along the vertical direction. Each of the plurality of first conductive structures extends along the first lateral direction and is coupled to the first sidewall through the ferroelectric segment. The semiconductor device includes a second conductive structure that extends along the vertical direction and is in contact with a first portion of the second sidewall. The semiconductor device includes a third conductive structure that extends along the vertical direction and is in contact with a second portion of the second sidewall.

In yet another aspect of the present disclosure, a method for making a memory device is disclosed. The method includes forming a plurality of first conductive structures separated from each other along a vertical direction. Each of the plurality of first conductive structures extends along a lateral direction. The method includes forming a ferroelectric segment and a channel segment both extending along the vertical direction, wherein the first conductive structures are electrically coupled to the channel segment through the ferroelectric segment. The ferroelectric segment has a first width along the lateral direction and the channel segment and has a second width along the lateral direction. The second width is greater than the first width. The method includes forming a second conductive structure and a third conductive structure extending along the vertical direction, wherein the second and third conductive structures are coupled to the channel segment and disposed opposite the channel segment from the ferroelectric segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first memory cell comprising:
      a channel segment that extends along a vertical direction, extends along a first lateral direction with a first end and a second end, and has a first sidewall and a second sidewall opposite to each other along a second lateral direction; and
      a first ferroelectric segment that extends along the vertical direction, extends along the first lateral direction with a third end and a fourth end, and is in contact with the first sidewall of the channel segment,
   wherein the third end is misaligned from the first end and the fourth end is misaligned from the second end.

2. The memory device of claim 1, further comprising:
   a plurality of first conductive structures that each extend along the second lateral direction and is coupled to the first sidewall of the channel segment through the first ferroelectric segment;
   a second conductive structure that extends along the vertical direction and is in contact with a first portion of the second sidewall of the channel segment; and
   a third conductive structure that extends along the vertical direction and is in contact with a second portion of the second sidewall of the channel segment, wherein the second and third conductive structures are electrically isolated from each other.

3. The memory device of claim 2, wherein the first memory cell includes a first one of the first conductive structures, the second conductive structure, and the third conductive structure.

4. The memory device of claim 3, further comprising a second memory cell that comprises:
   a second one of the first conductive structures;
   the second conductive structure;
   the third conductive structure;
   the channel segment; and
   the first ferroelectric segment.

5. The memory device of claim 1, further comprising a low-k dielectric material disposed next to each of the first end and the second end along the first lateral direction.

6. The memory device of claim 1, further comprising a gate dielectric segment extends along the vertical direction and is in contact with the second sidewall.

7. The memory device of claim 6, wherein the gate dielectric segment has a fifth end and a sixth end along the first lateral direction.

8. The memory device of claim 7, wherein the fifth end is misaligned from the first end and the sixth end is misaligned from the second end.

9. The memory device of claim 8, wherein the fifth end is aligned with the third end, while the sixth end is misaligned with the fourth end.

10. The memory device of claim 8, wherein the fifth end is misaligned with the third end, and the sixth end is misaligned with the fourth end.

11. The memory device of claim 1, wherein the channel segment has a thickness along the second lateral direction that varies toward at least one of the first end or the second end.

12. A memory device, comprising:
- a channel segment that extends along a vertical direction, extends along a first lateral direction with a first end and a second end, and has a first sidewall and a second sidewall opposite to each other along a second lateral direction;
- a first ferroelectric segment that extends along the vertical direction, extends along the first lateral direction with a third end and a fourth end, and is in contact with the first sidewall of the channel segment, wherein the third end is misaligned from the first end and the fourth end is misaligned from the second end;
- a plurality of first conductive structures that each extend along the second lateral direction and is coupled to the channel segment through the first ferroelectric segment;
- a second conductive structure that extends along the vertical direction and is in contact with a first portion of the second sidewall of the channel segment; and
- a third conductive structure that extends along the vertical direction and is in contact with a second portion of the second sidewall of the channel segment.

13. The memory device of claim 12, wherein the channel segment, the first ferroelectric segment, the plurality of first conductive structures, the second conductive structure, and the third conductive structure operatively form a plurality of memory cells.

14. The memory device of claim 12, further comprising a low-k dielectric material disposed next to each of the first end and the second end along the first lateral direction.

15. The memory device of claim 12, further comprising a gate dielectric segment extends along the vertical direction and is in contact with the second sidewall.

16. The memory device of claim 15, wherein, in addition to the first portion of the second sidewall of the channel segment, the second conductive structure is in contact with a first portion of the gate dielectric segment.

17. The memory device of claim 16, wherein, in addition to the second portion of the second sidewall of the channel segment, the third conductive structure is in contact with a second portion of the gate dielectric segment.

18. The memory device of claim 17, wherein the first and second portions of the gate dielectric segment is spaced apart from each other with a third portion of the gate dielectric segment.

19. A memory device, comprising:
- a channel segment that extends along a vertical direction, extends along a first lateral direction with a first end and a second end, and has a first sidewall and a second sidewall opposite to each other along a second lateral direction;
- a first ferroelectric segment that extends along the vertical direction, extends along the first lateral direction with a third end and a fourth end, and is in contact with the first sidewall of the channel segment, wherein the third end is misaligned from the first end and the fourth end is misaligned from the second end;
- a plurality of first conductive structures that each extend along the second lateral direction and is coupled to the channel segment through the first ferroelectric segment;
- a second conductive structure that extends along the vertical direction and is in contact with a first portion of the second sidewall of the channel segment;
- a third conductive structure that extends along the vertical direction and is in contact with a second portion of the second sidewall of the channel segment; and
- a gate dielectric segment extends along the vertical direction and is in contact with the second sidewall.

20. The memory device of claim 19, wherein the second conductive structure is in contact with a first portion of the gate dielectric segment, and the third conductive structure is in contact with a second portion of the gate dielectric segment.

* * * * *